United States Patent
Watanabe et al.

(10) Patent No.: US 10,181,442 B1
(45) Date of Patent: *Jan. 15, 2019

(54) THREE-DIMENSIONAL MEMORY DEVICE HAVING L-SHAPED WORD LINES AND METHODS OF MAKING THE SAME

(71) Applicant: SANDISK TECHNOLOGIES LLC, Plano, TX (US)

(72) Inventors: Kazuto Watanabe, Yokkaichi (JP); Michiaki Sano, Yokkaichi (JP); Haruki Urata, Yokkaichi (JP); Akira Takahashi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/826,796

(22) Filed: Nov. 30, 2017

(51) Int. Cl.
*H01L 27/1157* (2017.01)
*H01L 27/11565* (2017.01)
(Continued)

(52) U.S. Cl.
CPC .... *H01L 23/5283* (2013.01); *H01L 21/28273* (2013.01); *H01L 21/28282* (2013.01);
(Continued)

(58) Field of Classification Search
CPC ............. H01L 27/281; H01L 27/11524; H01L 27/11529; H01L 27/1157; H01L 27/11578;
(Continued)

(56) References Cited

U.S. PATENT DOCUMENTS

| 5,915,167 A | 6/1999 | Leedy |
| 7,936,004 B2 | 5/2011 | Kito et al. |

(Continued)

FOREIGN PATENT DOCUMENTS

| JP | 2011049561 A | 3/2011 |
| KR | 20100109745 A | 10/2010 |
| KR | 20110021444 A | 3/2011 |

OTHER PUBLICATIONS

Office Communication, Non-final Office Action for U.S. Appl. No. 15/451,773, dated Mar. 7, 2017, 23 pages.

(Continued)

*Primary Examiner* — Mohsen Ahmadi
(74) *Attorney, Agent, or Firm* — The Marbury Law Group PLLC

(57) ABSTRACT

A three-dimensional memory device includes an alternating stack of L-shaped insulating layers and L-shaped electrically conductive layers located over a top surface of a substrate, such that each of the L-shaped insulating layers and the L-shaped electrically conductive layers includes a respective horizontally-extending portion and a respective non-horizontally-extending portion, memory stack structures extending through a memory array region of the alternating stack that includes the horizontally-extending portions of the L-shaped electrically conductive layers, such that each of the memory stack structures includes a memory film and a vertical semiconductor channel, dielectric spacers non-horizontally extending between neighboring pairs of a non-horizontally-extending portion of an L-shaped insulating layer and a non-horizontally-extending portion of an L-shaped electrically conductive layer, and contact via structures that contact a respective one of the non-horizontally-extending portions of the L-shaped electrically conductive layers.

18 Claims, 24 Drawing Sheets

(51) Int. Cl.
| | |
|---|---|
| *H01L 27/11573* | (2017.01) |
| *H01L 27/11582* | (2017.01) |
| *H01L 27/11519* | (2017.01) |
| *H01L 27/11529* | (2017.01) |
| *H01L 23/528* | (2006.01) |
| *H01L 27/11524* | (2017.01) |
| *H01L 27/11556* | (2017.01) |
| *H01L 21/768* | (2006.01) |
| *H01L 23/522* | (2006.01) |
| *H01L 21/28* | (2006.01) |
| *H01L 27/11514* | (2017.01) |
| *H01L 27/06* | (2006.01) |
| *H01L 27/11578* | (2017.01) |

(52) U.S. Cl.
CPC .. *H01L 21/76816* (2013.01); *H01L 21/76877* (2013.01); *H01L 23/5226* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 27/0688* (2013.01); *H01L 27/11514* (2013.01); *H01L 27/11578* (2013.01)

(58) Field of Classification Search
CPC ......... H01L 27/11514; H01L 27/11551; H01L 27/11568; H01L 27/11597; H01L 21/76877
See application file for complete search history.

(56) References Cited

U.S. PATENT DOCUMENTS

| | | | |
|---|---|---|---|
| 7,952,136 B2 * | 5/2011 | Kito | ........................ G11C 16/10 |
| | | | 257/326 |
| 8,187,932 B2 | 5/2012 | Nguyen et al. | |
| 8,363,481 B2 | 1/2013 | Kidoh et al. | |
| 8,394,716 B2 | 3/2013 | Hwang et al. | |
| 8,520,425 B2 | 8/2013 | Xiao et al. | |
| 8,587,052 B2 * | 11/2013 | Yun | .................... H01L 29/66833 |
| | | | 257/324 |
| 8,592,912 B2 | 11/2013 | Hwang et al. | |
| 8,884,357 B2 | 11/2014 | Wang et al. | |
| 8,946,023 B2 | 2/2015 | Makala et al. | |
| 8,981,567 B2 | 3/2015 | Hu et al. | |
| 9,165,774 B2 | 10/2015 | Oh et al. | |
| 9,196,628 B1 | 11/2015 | Chen | |
| 9,230,987 B2 | 1/2016 | Pachamuthu et al. | |
| 9,356,034 B1 | 5/2016 | Yada et al. | |
| 9,502,332 B2 | 11/2016 | Lim et al. | |
| 9,716,062 B2 | 7/2017 | Yada et al. | |
| 2008/0099819 A1 | 5/2008 | Kito et al. | |
| 2008/0149913 A1 | 6/2008 | Tanaka et al. | |
| 2009/0230449 A1 * | 9/2009 | Sakaguchi | .......... H01L 27/0688 |
| | | | 257/298 |
| 2010/0090188 A1 | 4/2010 | Futatsuyama | |
| 2010/0254191 A1 | 10/2010 | Son et al. | |
| 2011/0204420 A1 | 8/2011 | Kim et al. | |
| 2011/0316072 A1 | 12/2011 | Lee | |
| 2012/0112264 A1 * | 5/2012 | Lee | .................... H01L 27/11551 |
| | | | 257/324 |
| 2012/0193705 A1 | 8/2012 | Lim et al. | |
| 2012/0195128 A1 * | 8/2012 | Fujiwara | ............. G11C 11/5628 |
| | | | 365/185.24 |
| 2012/0256247 A1 | 10/2012 | Alsmeier | |
| 2012/0322252 A1 | 12/2012 | Son et al. | |
| 2013/0270714 A1 * | 10/2013 | Lee | .................... H01L 21/76802 |
| | | | 257/774 |
| 2014/0021632 A1 | 1/2014 | Lee et al. | |
| 2014/0061776 A1 | 3/2014 | Kwon et al. | |
| 2014/0183756 A1 | 7/2014 | Hwang et al. | |
| 2015/0069616 A1 | 3/2015 | Oh et al. | |
| 2015/0179577 A1 | 6/2015 | Tobitsuka et al. | |
| 2015/0179659 A1 | 6/2015 | Takaki et al. | |
| 2015/0179660 A1 * | 6/2015 | Yada | ................. H01L 21/02164 |
| | | | 257/321 |
| 2015/0340366 A1 | 11/2015 | Lim et al. | |
| 2016/0204117 A1 | 7/2016 | Liu et al. | |
| 2016/0358855 A1 | 12/2016 | Oh | |
| 2017/0077139 A1 | 3/2017 | Iguchi | |

OTHER PUBLICATIONS

Endoh et al., "Novel Ultra High Density Memory with a Stacked-Surrounding Gate Transistor (S-SGT) Structured Cell," IEDM Proc. (2001) 33-36.
Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.
U.S. Appl. No. 15/251,374, filed Aug. 30, 2016, SanDisk Technologies LLC.
U.S. Appl. No. 15/367,791, filed Dec. 2, 2016, SanDisk Technologies LLC.
U.S. Appl. No. 15/451,773, filed Mar. 7, 2017 SanDisk Technologies LLC.
U.S. Appl. No. 15/805,599, filed Nov. 7, 2017, SanDisk Technologies LLC.

* cited by examiner

THREE-DIMENSIONAL MEMORY DEVICE HAVING L-SHAPED WORD LINES AND METHODS OF MAKING THE SAME

FIELD

The present disclosure relates generally to the field of semiconductor devices, and particular to a three-dimensional memory device employing L-shaped word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of L-shaped insulating layers and L-shaped electrically conductive layers located over a top surface of a substrate, such that each of the L-shaped insulating layers and the L-shaped electrically conductive layers includes a respective horizontally-extending portion and a respective non-horizontally-extending portion, memory stack structures extending through a memory array region of the alternating stack that includes the horizontally-extending portions of the L-shaped electrically conductive layers, such that each of the memory stack structures includes a memory film and a vertical semiconductor channel, dielectric spacers non-horizontally extending between neighboring pairs of a non-horizontally-extending portion of an L-shaped insulating layer and a non-horizontally-extending portion of an L-shaped electrically conductive layer, and contact via structures that contact a respective one of the non-horizontally-extending portions of the L-shaped electrically conductive layers.

According to another aspect of the present disclosure, a method of forming a three-dimensional memory device is provided, which comprises: forming a mesa structure over a substrate; performing multiple times a set of processing steps comprising an insulating layer deposition step in which an insulating layer is conformally deposited, a dielectric spacer formation step in which a dielectric spacer is formed, and a sacrificial material layer deposition step in which a sacrificial material layer is conformally deposited; removing portions of the insulating layers, the dielectric spacers, and the sacrificial material layers from above a horizontal plane including a top surface of the mesa structure by a planarization process, wherein an alternating stack of L-shaped insulating layers and L-shaped sacrificial material layers is formed over the substrate and on a sidewall of the mesa structure; forming memory stack structures through a memory array region of the alternating stack that includes the horizontally-extending portions of the L-shaped electrically conductive layers, wherein each of the memory stack structures comprises a memory film and a vertical semiconductor channel; replacing the L-shaped sacrificial material layers with L-shaped electrically conductive layers; and forming contact via structures on a respective one of vertically-extending portions of the L-shaped electrically conductive layers.

DETAILED DESCRIPTION

Figure 1:
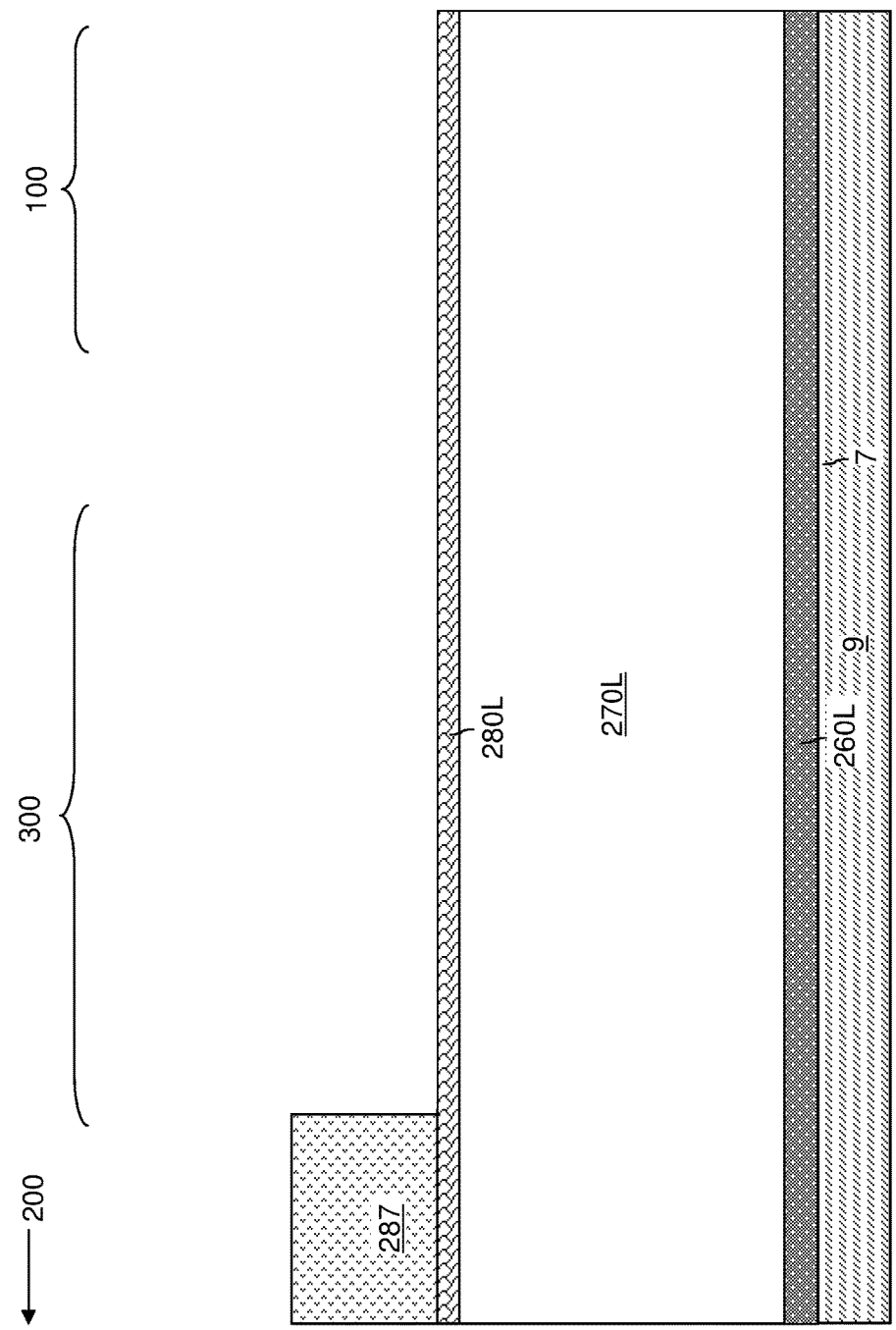
FIG. 1 is a schematic vertical cross-sectional view of an exemplary structure after formation of a lower template layer, an upper template layer, a planarization stopping layer, and a patterned photoresist layer according to an embodiment of the present disclosure.

As discussed above, the present disclosure is directed to a three-dimensional memory device employing L-shaped word lines and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a top surface 7, which can be, for example, a topmost surface of the substrate semiconductor layer 9. The top surface 7 can be a semiconductor surface. In one embodiment, the top surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device (not shown) for a peripheral circuitry can be formed on a portion of the substrate semiconductor layer 9. The at least one semiconductor device can include, for example, field effect transistors. The least one semiconductor device for the peripheral circuitry can contain a driver circuit for memory devices to be subsequently formed, which can include at least one NAND device. The region (i.e., area) of the at least one semiconductor device is herein referred to as a peripheral device region 200, which is located outside of the illustrated region of the exemplary structure in FIG. 1. The region in which a memory array is subsequently formed is herein referred to as a memory array region 100. A contact region 300 for subsequently forming stepped terraces of electrically conductive layers can be provided between the memory array region 100 and the peripheral device region 200.

At least one template layer (260L, 270L) can be deposited on the top surface 7 of the substrate layer 9. In one embodiment, the at least one template layer (260L, 270L) can include a lower template layer 260L and an upper template layer 270L. The lower template layer 260L can include a first dielectric material that can be etched with a taper during a subsequent anisotropic etch. The upper template layer 270L can include a second dielectric material that can be etched with vertical sidewalls during the subsequent anisotropic etch. For example, the lower template layer 260L can include silicon nitride or aluminum oxide, and the upper template layer 270L can include silicon oxide. The total thickness of the at least one template layer (260L, 270L) can be greater than the thickness of an alternating stack of insulating layers and sacrificial material layers to be subsequently formed. For example, the lower template layer 260L can have a thickness in a range from 100 nm to 2,000 nm, and the upper template layer 270L can have a thickness in a range from 1,000 nm to 20,000 nm, although lesser and greater thicknesses can also be employed. In an alternative embodiment, the lower template layer 260L may be omitted, and the at least one template layer (260L, 270L) may consist of a single template layer such as the upper template layer 270L.

An optional planarization stopping layer 280L can be formed over the at least one template layer (260L, 270L). The planarization stopping layer 280L includes a material that can be employed as a stopping layer for a chemical mechanical planarization process to be subsequently performed. For example, the planarization stopping layer 280L can include polysilicon or a dielectric metal oxide. The thickness of the planarization stopping layer 280L can be in a range from 10 nm to 200 nm, such as from 10 nm to 100 nm, although lesser and greater thicknesses can also be employed. A photoresist layer 287 can be applied over the planarization stopping layer 280L, can be lithographically patterned to cover to a region adjacent to the contact region 300.

Figure 2:
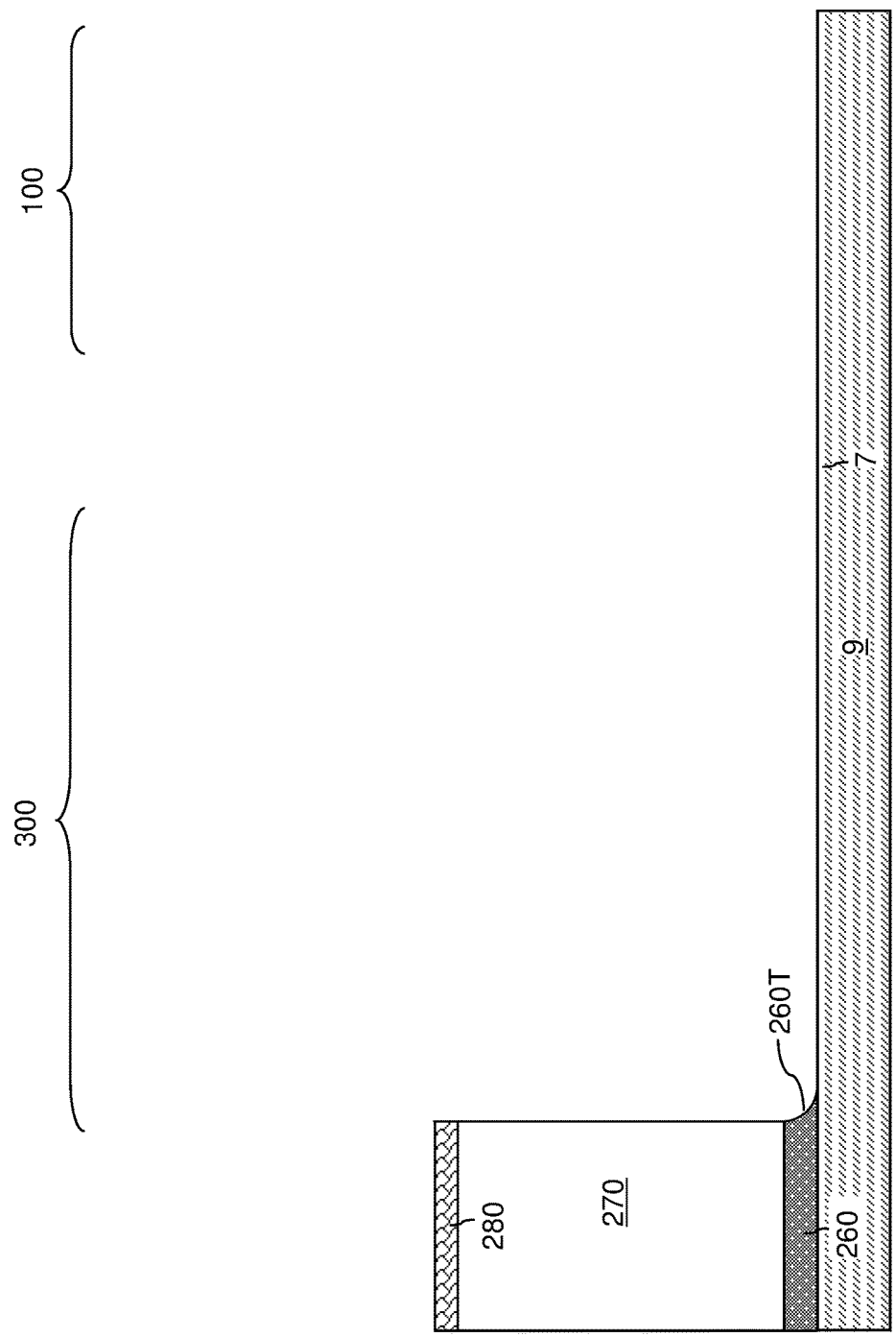
FIG. 2 is a schematic vertical cross-sectional view of the exemplary structure after patterning the planarization stopping layer, the upper template layer, and the lower template layer to form a mesa structure according to an embodiment of the present disclosure.

Referring to FIG. 2, an anisotropic etch is performed to transfer the pattern of the photoresist layer 287 through the planarization stopping layer 280L and the at least one template layer (260L, 270L). The isotropic etch can include multiple etch steps for sequentially etching the materials of the planarization stopping layer 280L and the at least one template layer (260L, 270L). For example, if the upper template layer 270L includes silicon oxide, a reactive ion etch employing a combination of $C_4F_6$, Ar, and $O_2$ or a combination of $C_4F_8$, Ar, and $O_2$ can be employed to pattern the upper template layer 270L with vertical sidewalls. If the lower template layer 260L includes silicon nitride, the top surface of the lower template layer 260L can be cleaned using $O_2$ or $O_2$/Ar chemistry. Subsequently, the lower template layer 260L including silicon nitride can be etched with a tapered sidewall employing a combination of $CHF_3$, Ar, and $O_2$ or $CH_2F_2$, Ar, and $O_2$. Low electrostatic chuck (ESC) temperature in a range from −10 degrees Celsius to 20 degrees Celsius can facilitate accumulation of residual material from the etch process (which may be from the combination of materials from the upper template layer 270L, the photoresist layer 287, and the etch gas) on the sidewalls of remaining portions of the lower template layer 260L and induce formation of tapered sidewalls 260T on the remaining portion of the lower template layer 260L. The top surface 7 of the substrate semiconductor layer 9 can be physically exposed after the anisotropic etch process.

The remaining portion of the planarization stopping layer 280L is herein referred to as a planarization stopping structure 280, the remaining portion of the upper template layer 270L is herein referred to as an upper template structure 270, and the remaining portion of the lower template layer 270L is herein referred to as a lower template structure 260. The upper template structure 270 can have non-horizontal sidewalls having an angle of 60 to 90 degrees with respect to a horizontal direction (e.g., with respect to the top surface 7 of the substrate), including vertical sidewalls (i.e., having an angle of 90 degrees with respect to the horizontal direction). The lower template structure 260 can have tapered sidewalls. The photoresist layer 287 can be subsequently removed, for example, by ashing. The combination of the lower template structure 260 and the upper template structure 270 constitutes a mesa structure (260, 270) that protrudes above the top surface 7 of the substrate semiconductor layer 9. In one embodiment the mesa structure can have a planar top surface (which is the top surface of the upper template structure 270). In another embodiment, the mesa structure can have a non-planar top surface.

Figure 3:
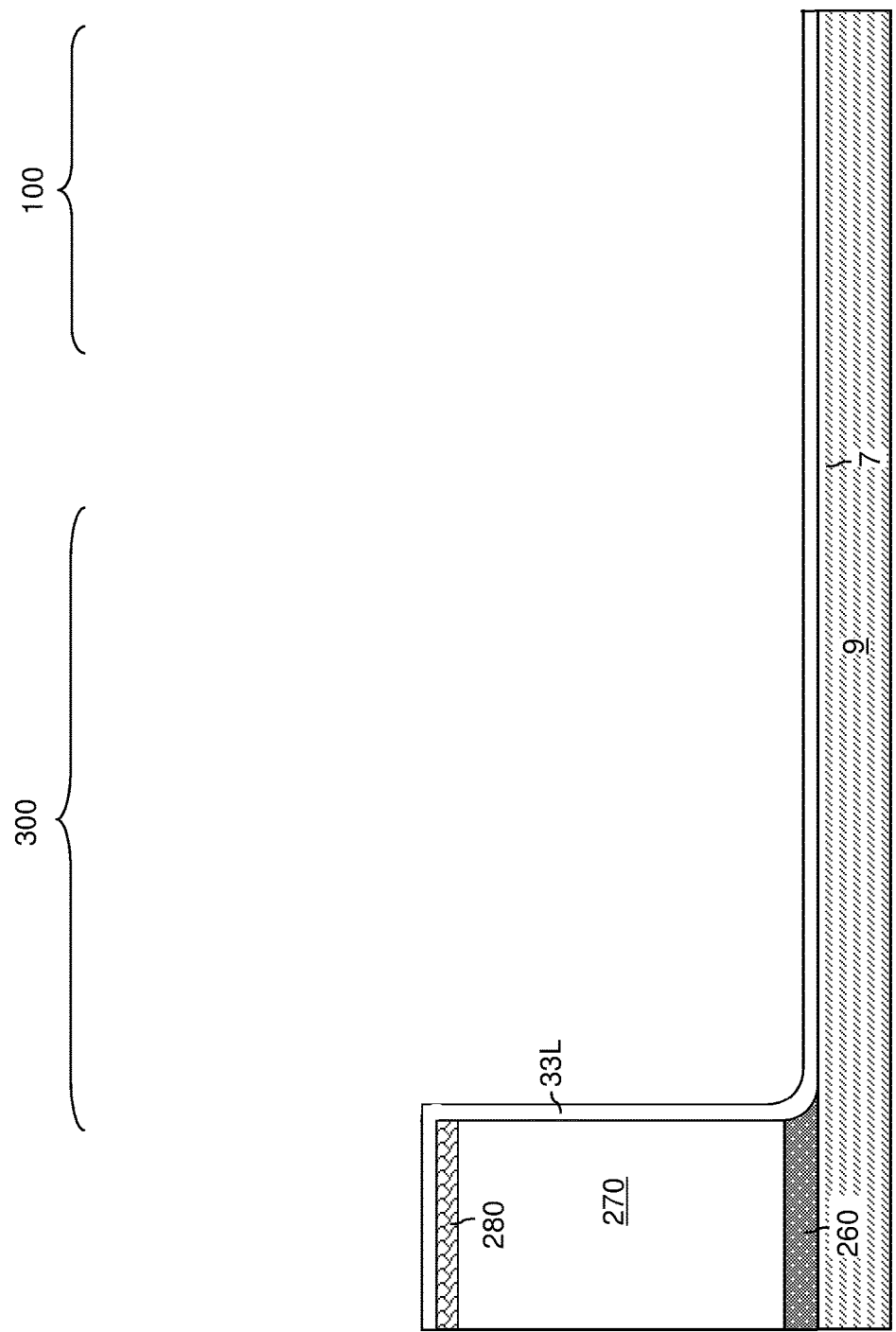
FIG. 3 is a schematic vertical cross-sectional view of the exemplary structure after formation of a Z-shaped dielectric spacer material layer according to an embodiment of the present disclosure.

Referring to FIG. 3, an optional Z-shaped dielectric spacer material layer 33L can be formed on the top surface 7 of the substrate semiconductor layer 9, on the sidewalls of the mesa structure (260, 270), and on the top surface of the mesa structure (260, 270). As used herein, a "Z-shaped" element refers to an element that includes a pair of horizontally extending portions that are adjoined by a connecting portion that extends along a non-horizontal direction (e.g., having an angle of 60 to 90 degrees with respect to a horizontal direction), such as a vertical direction. Specifically, the Z-shaped dielectric spacer material layer 33L includes a first horizontal portion that contacts the top surface 7 of the substrate semiconductor layer 9, a second horizontal portion that overlies the mesa structure (260, 270), and a non-horizontal portion, such as a vertical portion, that connects the first horizontal portion and the second horizontal portion. The Z-shaped dielectric spacer material layer 33L is a continuous dielectric material layer including a dielectric material that is subsequently incorporated into a dielectric spacer. For example, the Z-shaped dielectric spacer material layer 33L can include silicon oxide, which may, or may not, be doped with dopants such as B, P, F, or As. The Z-shaped dielectric spacer material layer 33L can be formed by a conformal deposition process such as low pressure chemical vapor deposition. The thickness of the Z-shaped dielectric spacer material layer 33L can be in a range from 15 nm to 200 nm, although lesser and greater thicknesses can also be employed. In another embodiment, the Z-shaped dielectric spacer material layer 33L may be omitted.

Figure 4:
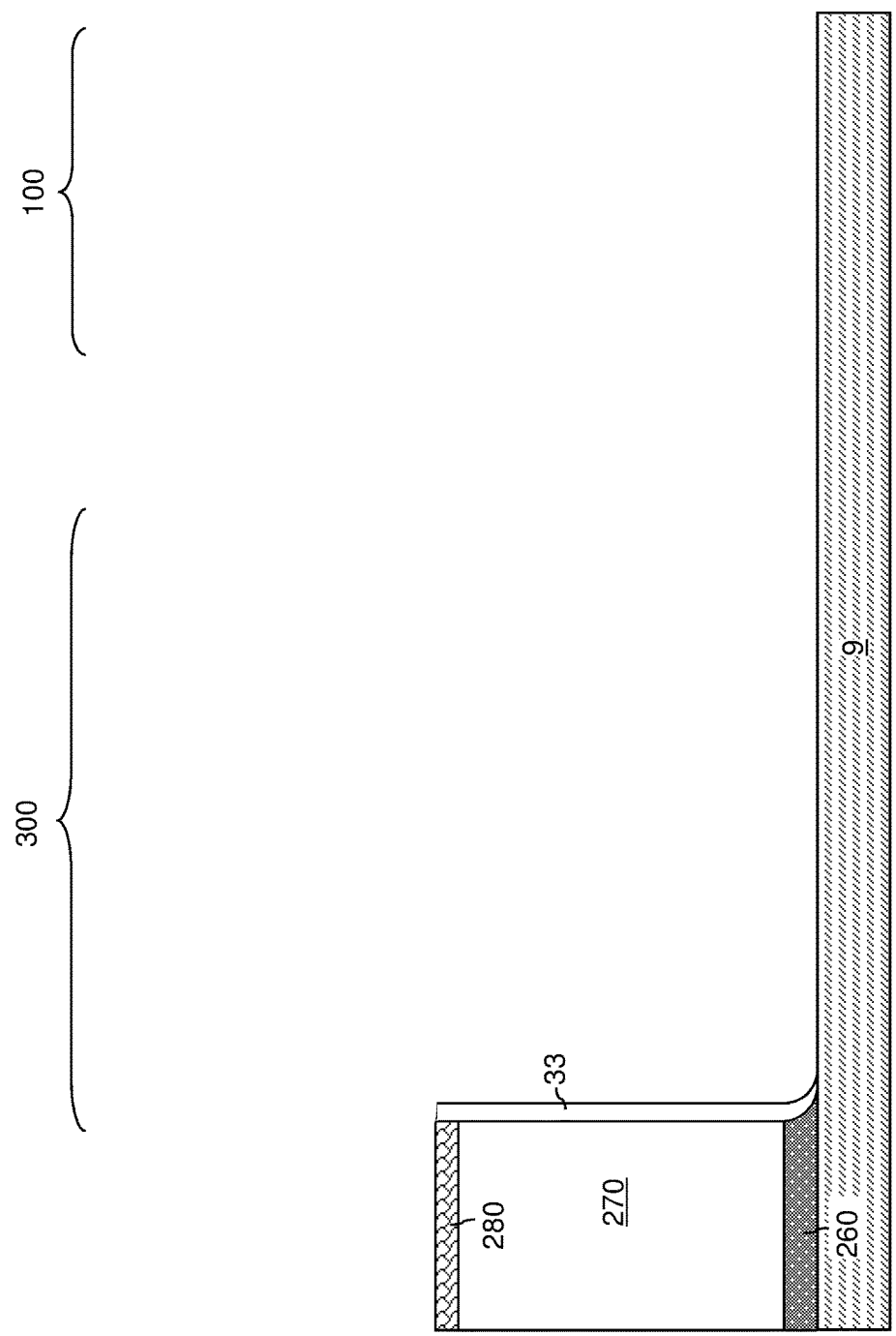
FIG. 4 is a schematic vertical cross-sectional view of the exemplary structure after formation of a dielectric spacer according to an embodiment of the present disclosure.

Referring to FIG. 4, an anisotropic etch process is performed to remove horizontal portions of the Z-shaped dielectric spacer material layer 33L from above the top surface of the substrate semiconductor layer 9 and from above the top surface of the mesa structure (260, 270). For example, etch chemistry employing $C_4F_8$ and/or $C_4F_6$, Ar, and $O_2$ can be employed to anisotropically etch the Z-shaped dielectric spacer material layer 33L. Remaining vertical portions of the Z-shaped dielectric spacer material layer 33L can have a spacer shape, such as a rectangular or cylindrical spacer shape, and is herein referred to as a dielectric spacer 33. The dielectric spacer 33 includes a vertical portion located at an edge of the contact region 300. In one embodiment, the vertical portion of the dielectric spacer 33 can laterally extend along a horizontal direction that is perpendicular to the direction connecting the memory array region 100 and the contact region 300, which is the direction perpendicular to the view illustrated in FIG. 4 (i.e., perpendicular to the plane of view in FIG. 4). The dielectric spacer 33 is optional and can be omitted in an alternative embodiment.

Figure 5:
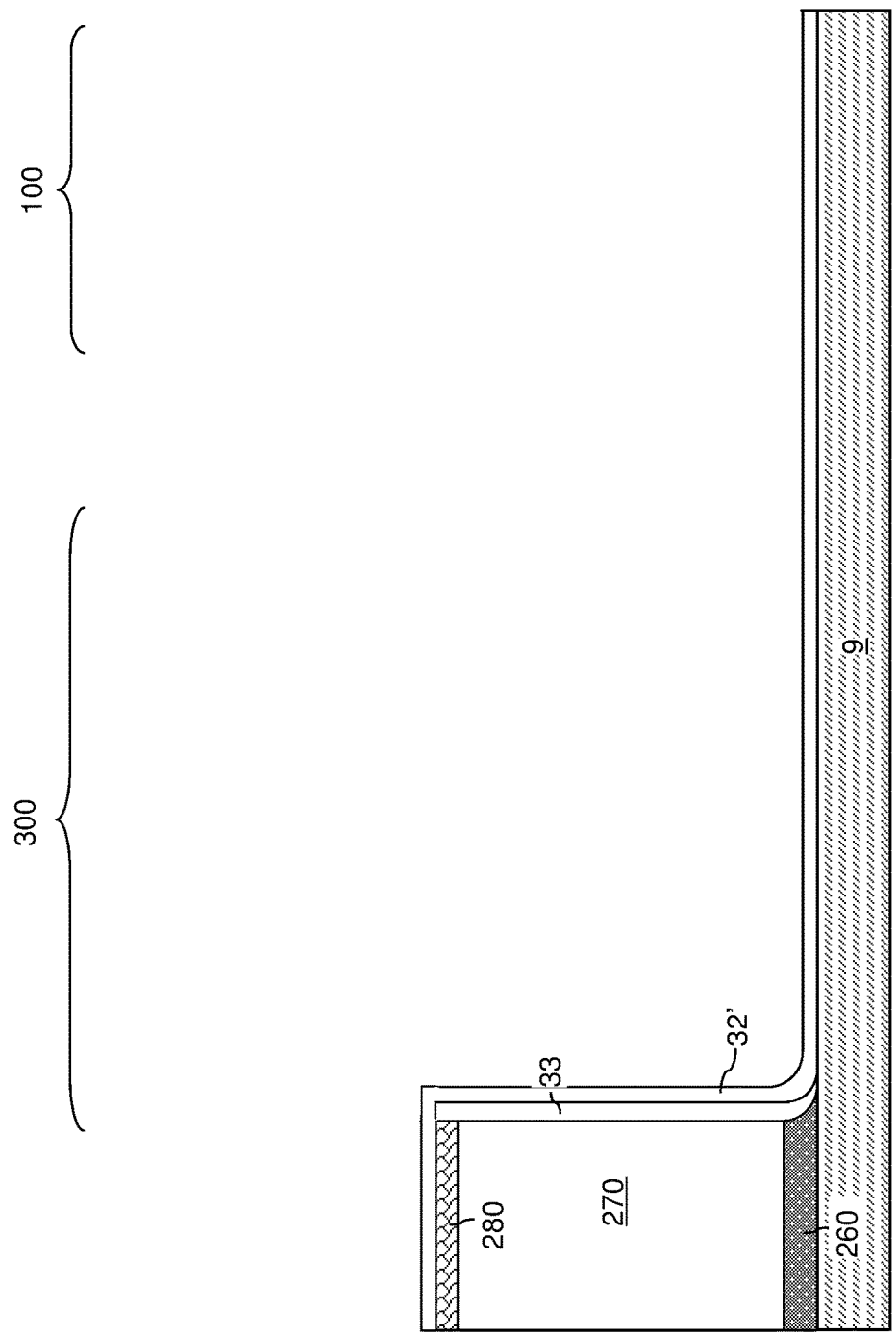
FIG. 5 is a schematic vertical cross-sectional view of the exemplary structure after formation of a Z-shaped insulating layer according to an embodiment of the present disclosure.

Referring to FIG. 5, a Z-shaped insulating layer 32' can be deposited on the top surface 7 of the substrate semiconductor layer 9, on the sidewalls of the dielectric spacer 33, and on the top surface of the mesa structure (260, 270). The Z-shaped insulating layer 32' is a continuous insulating material layer including a dielectric material that is subsequently combined with the dielectric spacer 33. The Z-shaped insulating layer 32' includes a first horizontal portion that contacts the top surface of the substrate semiconductor layer 9, a second horizontal portion that contacts the top surface of the mesa structure (260, 270), and a non-horizontally extending portion having an angle of 60 to 90 degrees with respect to a horizontal direction, such as a vertically-extending portion that connects the first horizontal portion and the second horizontal portion and contacting the dielectric spacer 33. The insulating material of the Z-shaped insulating layer 32' may be the same as, or may be different from, the dielectric material of the dielectric spacer 33. In one embodiment, the Z-shaped insulating layer 32' can include silicon oxide, which may, or may not, be doped with dopants such as B, P, F, or As. In one embodiment, the Z-shaped insulating layer 32' may consist essentially of $SiO_2$ with a trace level of hydrogen atoms and/or carbon atoms. The Z-shaped insulating layer 32' can be formed by a conformal deposition process such as low pressure chemical vapor deposition. The thickness of the Z-shaped insulating layer 32' can be in a range from 25 nm to 60 nm, although lesser and greater thicknesses can also be employed.

Figure 6:
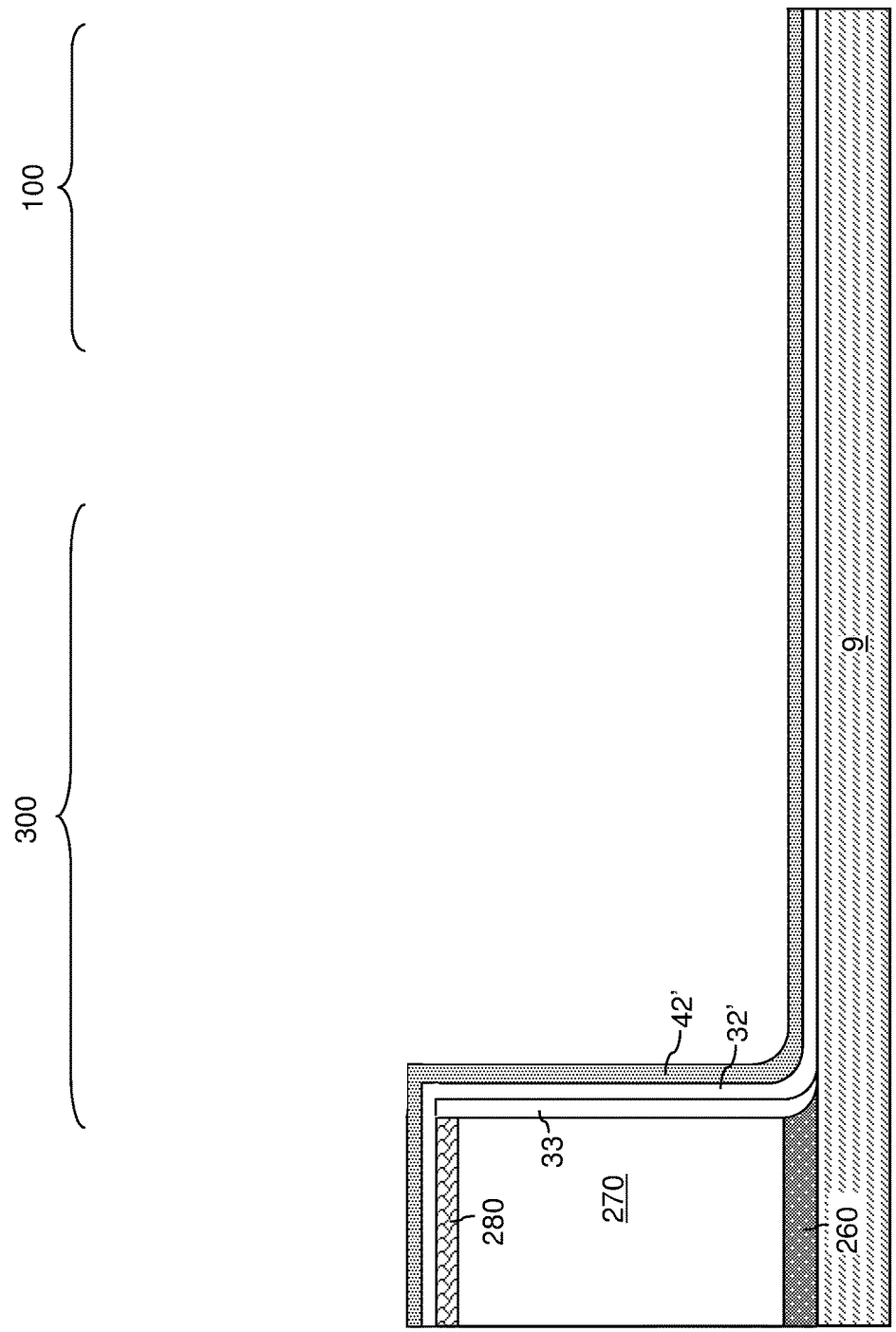
FIG. 6 is a schematic vertical cross-sectional view of the exemplary structure after formation of a Z-shaped sacrificial material layer according to an embodiment of the present disclosure.

Referring to FIG. 6, a Z-shaped sacrificial material layer 42' can be deposited on the Z-shaped insulating layer 32'. The Z-shaped sacrificial material layer 42' is a continuous sacrificial material layer including a sacrificial material that spatially separates the Z-shaped insulating layer 32' from another Z-shaped insulating layer to be subsequently formed. The Z-shaped sacrificial material layer 42' includes a first horizontal portion located in the memory array region 100 and the contact region 300, a second horizontal portion overlying the mesa structure (260, 270), and a non-horizontally extending portion having an angle of 60 to 90 degrees with respect to a horizontal direction, such as a vertically-extending portion that connects the first horizontal portion and the second horizontal portion. In one embodiment, the spacer material can be a sacrificial material that is subsequently replaced with an electrically conductive material. For example, the sacrificial material of the Z-shaped sacrificial material layer 42' can be silicon nitride. The Z-shaped sacrificial material layer 42' can be formed by a conformal deposition process such as low pressure chemical vapor deposition. The thickness of the Z-shaped sacrificial material layer 42' can be in a range from 25 nm to 60 nm, although lesser and greater thicknesses can also be employed.

Figure 7:
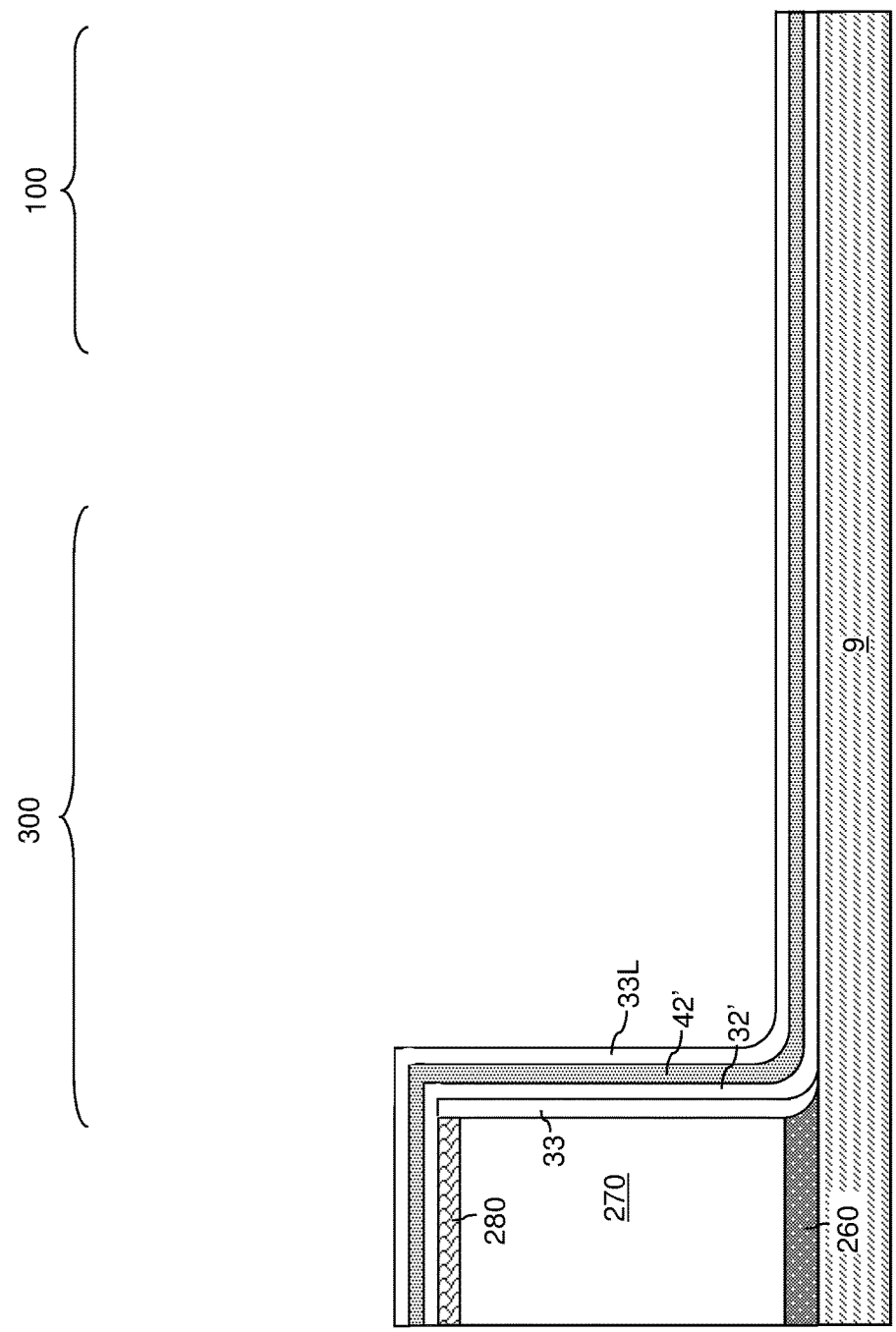
FIG. 7 is a schematic vertical cross-sectional view of the exemplary structure after formation of a Z-shaped dielectric spacer material layer according to an embodiment of the present disclosure.

Referring to FIG. 7, the processing steps of FIG. 3 can be performed to form another Z-shaped dielectric spacer material layer 33L, which is herein referred to as a second Z-shaped dielectric spacer material layer 33L. The second Z-shaped dielectric spacer material layer 33L can have the same composition and the same thickness as the Z-shaped dielectric spacer material layer 33L formed at the processing steps of FIG. 3.

Figure 8:
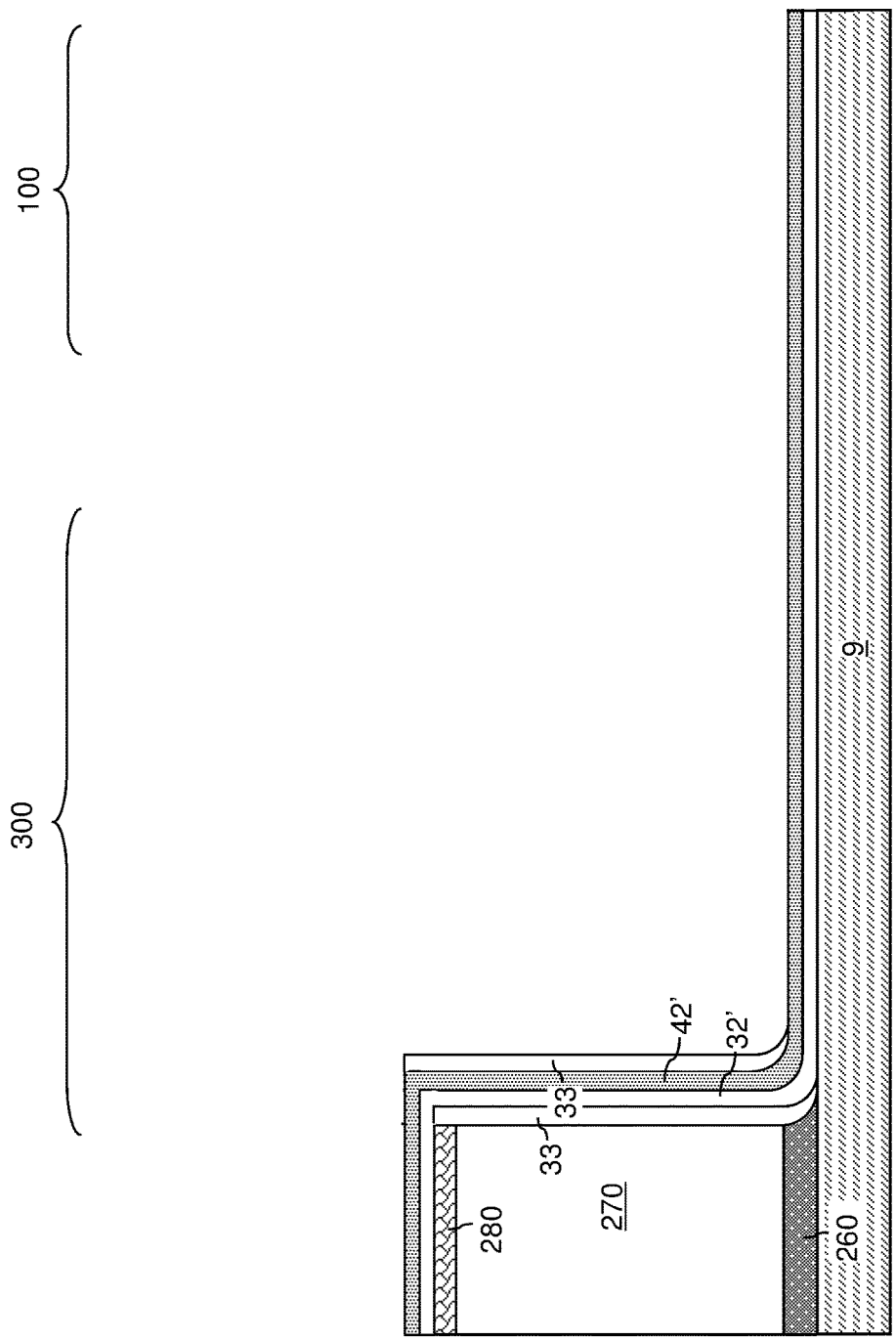
FIG. 8 is a schematic vertical cross-sectional view of the exemplary structure after formation of a dielectric spacer according to an embodiment of the present disclosure.

Referring to FIG. 8, the processing steps of FIG. 4 can be performed to form another dielectric spacer 33, which is herein referred to as a second dielectric spacer 33. The second dielectric spacer 33 can have the same composition and the same thickness as the dielectric spacer 33 that is formed at the processing steps FIG. 4.

Figure 9:
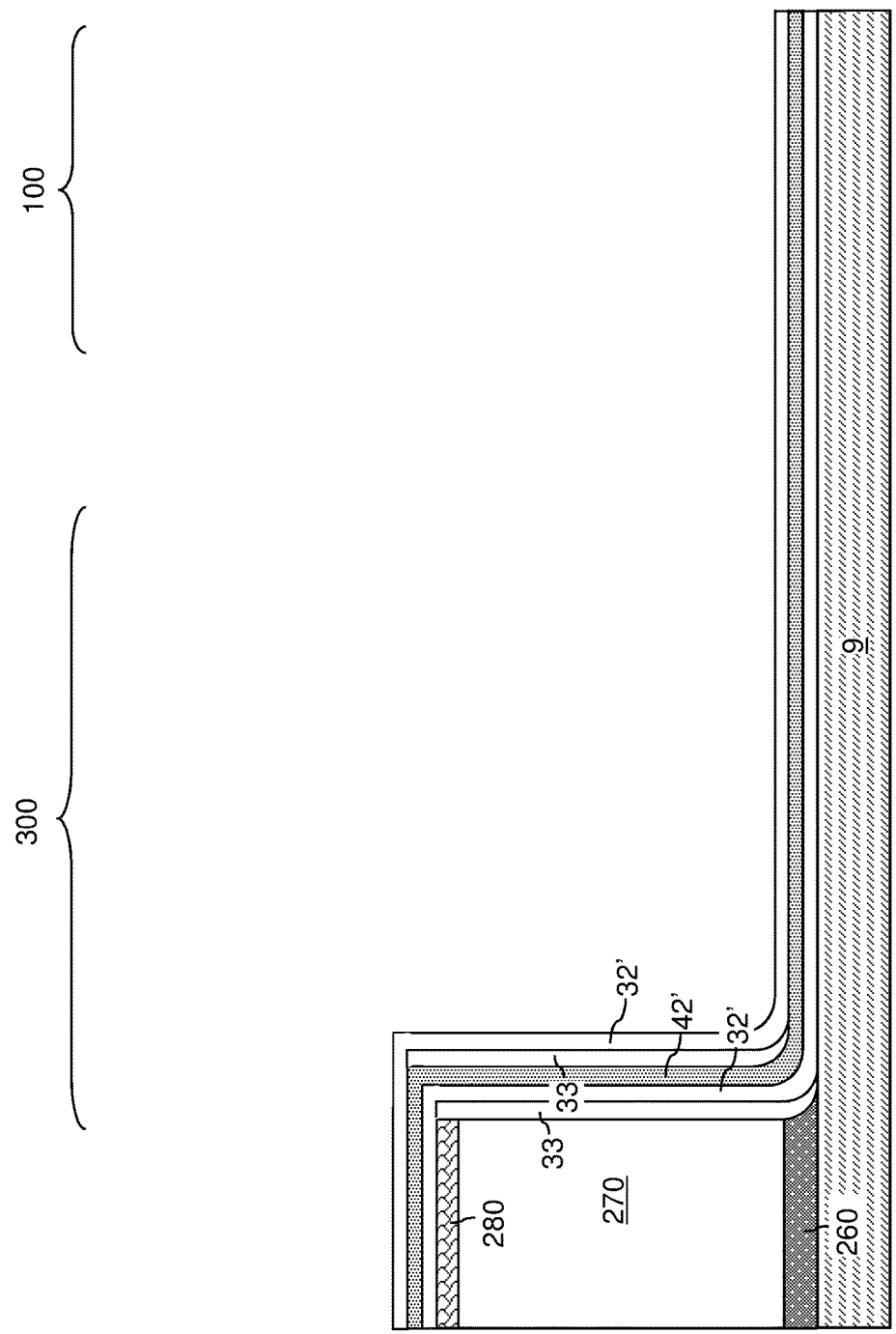
FIG. 9 is a schematic vertical cross-sectional view of the exemplary structure after formation of a Z-shaped insulating layer according to an embodiment of the present disclosure.

Referring to FIG. 9, the processing steps of FIG. 5 can be performed to form another Z-shaped insulating layer 32', which is herein referred to as a second Z-shaped insulating layer 32'. The second Z-shaped insulating layer 32' can have the same composition and the same thickness as the Z-shaped insulating layer 32' formed at the processing steps of FIG. 5.

Figure 10:
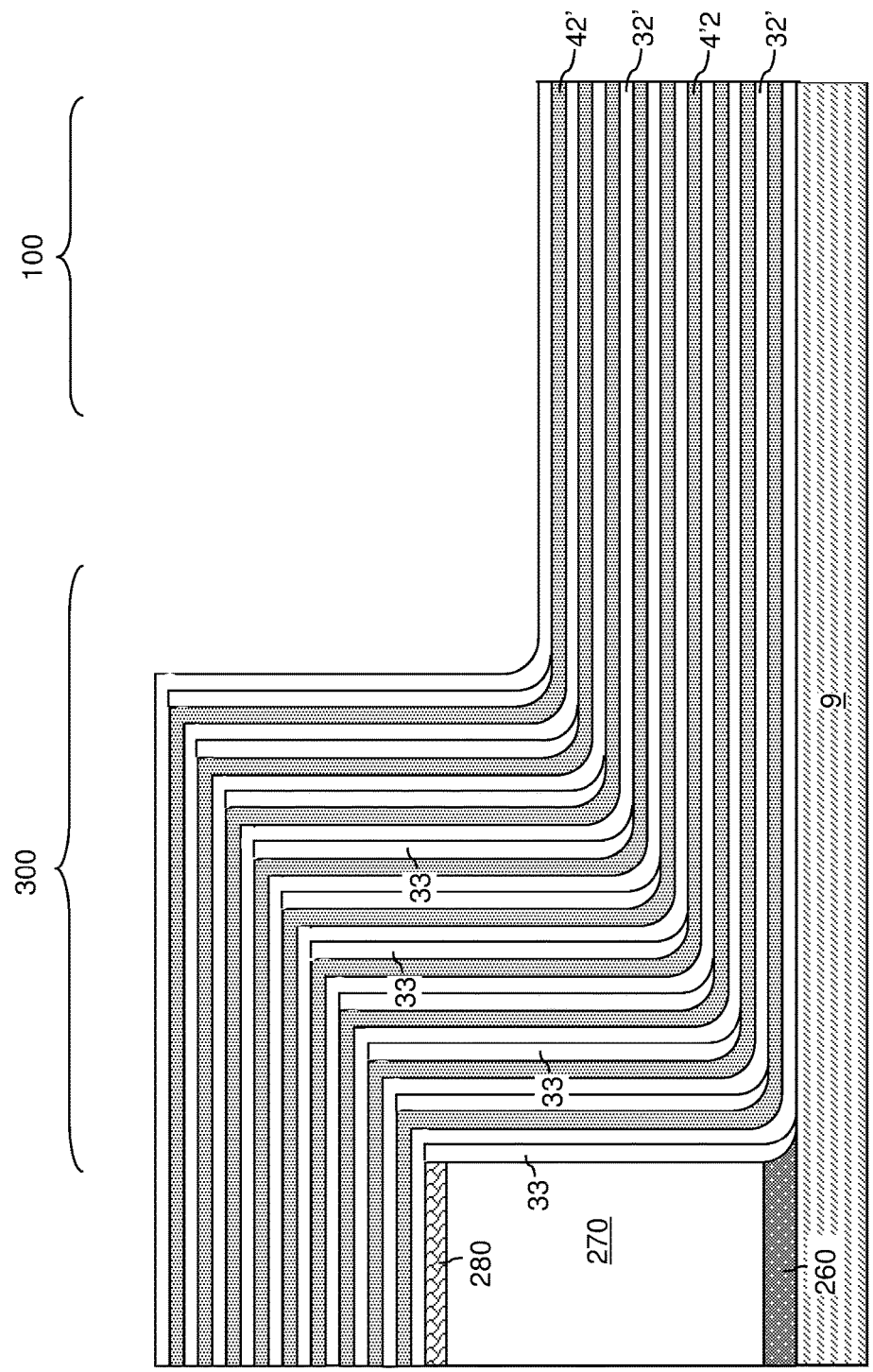
FIG. 10 is a schematic vertical cross-sectional view of the exemplary structure after formation of multiple sets of a dielectric spacer, a Z-shaped insulating layer, and a Z-shaped sacrificial material layer according to an embodiment of the present disclosure.

Referring to FIG. 10, the processing steps of FIG. 6 can be performed to form another Z-shaped sacrificial material layer 42', which is herein referred to as a second Z-shaped sacrificial material layer 42'. The second Z-shaped sacrificial material layer 42' can have the same composition and the same thickness as the Z-shaped sacrificial material layer 42' formed at the processing steps of FIG. 6.

Subsequently, the set of processing steps of FIGS. 3-6 can be repeated multiple times, such as 31 to 127 times. Each set of processing steps can form a dielectric spacer 33, a Z-shaped insulating layer 32', and a Z-shaped sacrificial material layer 42' to form a total of 32 to 128 sets of layers, such as 64 to 128 sets of layers (32, 33' 42'). Generally, a set of processing steps can be repeated multiple times provided that the set of processing steps includes an insulating layer deposition step in which a Z-shaped insulating layer 32' is conformally deposited, a dielectric spacer formation step in which a dielectric spacer 33 is formed, and a sacrificial material layer deposition step in which a Z-shaped sacrificial material layer 42' is conformally deposited. The order of the processing steps within the set of processing steps can be rearranged as needed. In some embodiments, a Z-shaped sacrificial material layer 42' is deposited directly on horizontal surfaces of a Z-shaped insulating layer 32' within each set of processing steps. In some other embodiments, a Z-shaped insulating layer 32' is deposited directly on horizontal surfaces of a Z-shaped sacrificial material layer 42' within each set of processing steps. In some embodiments, a Z-shaped sacrificial material layer 42' is deposited directly on a sidewall of a dielectric spacer 33 within each set of processing steps. In some other embodiments, a Z-shaped insulating layer 32' is deposited directly on a sidewall of a dielectric spacer 33 within each set of processing steps.

An alternating stack (32', 42') of Z-shaped insulating layers 32' and Z-shaped sacrificial material layers 42' is formed over the substrate semiconductor layer 9 and the mesa structure (260, 270). A dielectric spacer 33 is provided between each neighboring pairs of a Z-shaped insulating layer 32' and a Z-shaped sacrificial material layer 42'. The lateral extent of vertical portions of the alternating stack (32', 42') in the contact region 300 is greater than the vertical thickness of the alternating stack (32', 42') in the memory array region 100 by the total lateral thickness of the dielectric spacers 33. In one embodiment, the dielectric spacers 33 have a lateral width that is in a range from 50% to 400% of an average lateral width of the non-horizontally extending portions, such as the vertically-extending portions of the insulating layers 32'.

Figure 11:
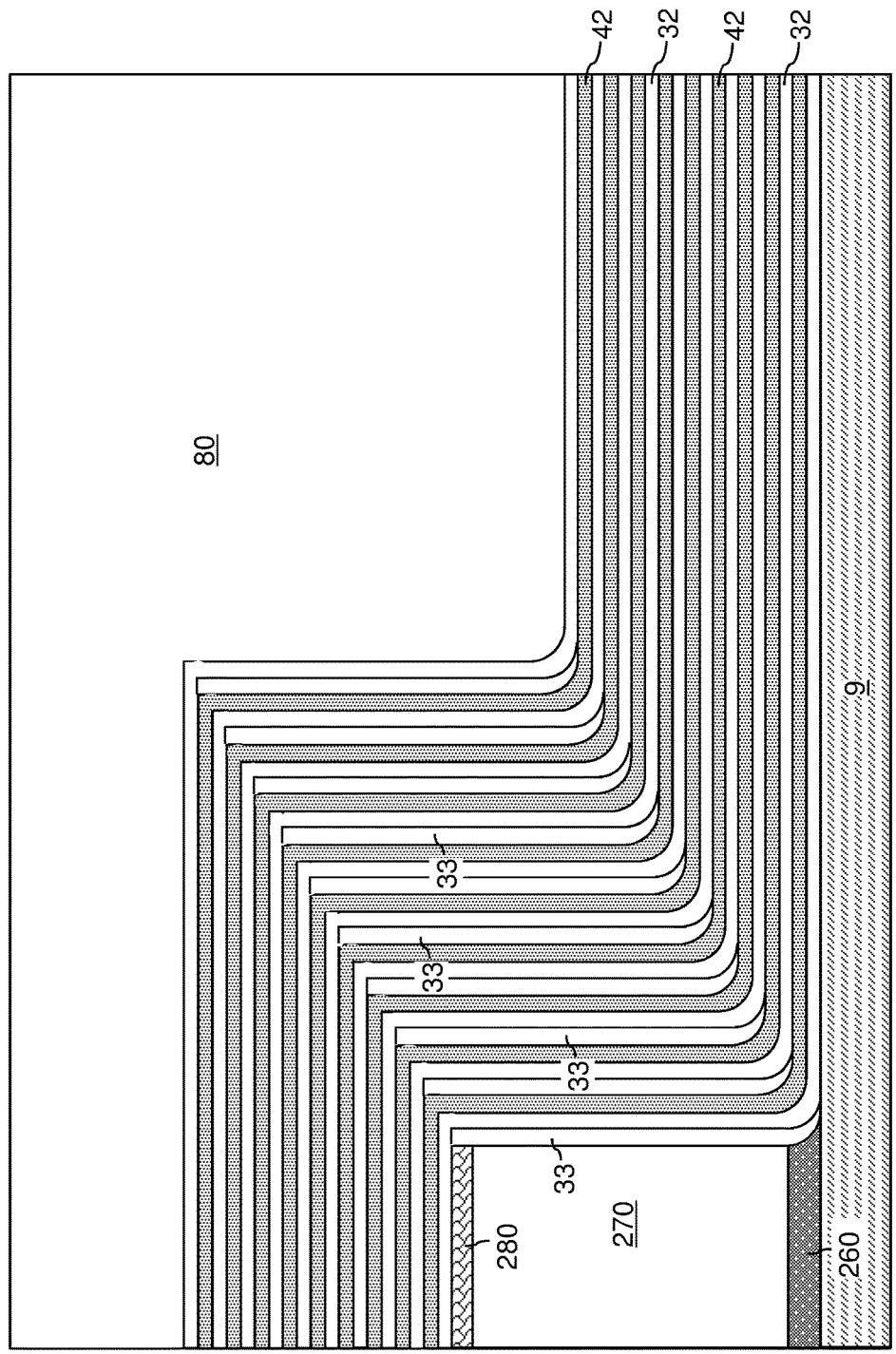
FIG. 11 is a schematic vertical cross-sectional view of the exemplary structure after formation of a planarization dielectric layer according to an embodiment of the present disclosure.

Referring to FIG. 11, a planarizable dielectric material is deposited over the alternating stack (32', 42') to form a planarization dielectric layer 80. The planarizable dielectric material may be a self-planarizing material such as spin-on glass (SOG), or a dielectric material such as doped silicate glass or undoped silicate glass that can be planarized by chemical mechanical planarization (CMP) process. The lowest portion of the top surface of the planarization dielectric layer 80 can be located above the horizontal plane including the top surface of the upper template structure 270.

Figure 12:
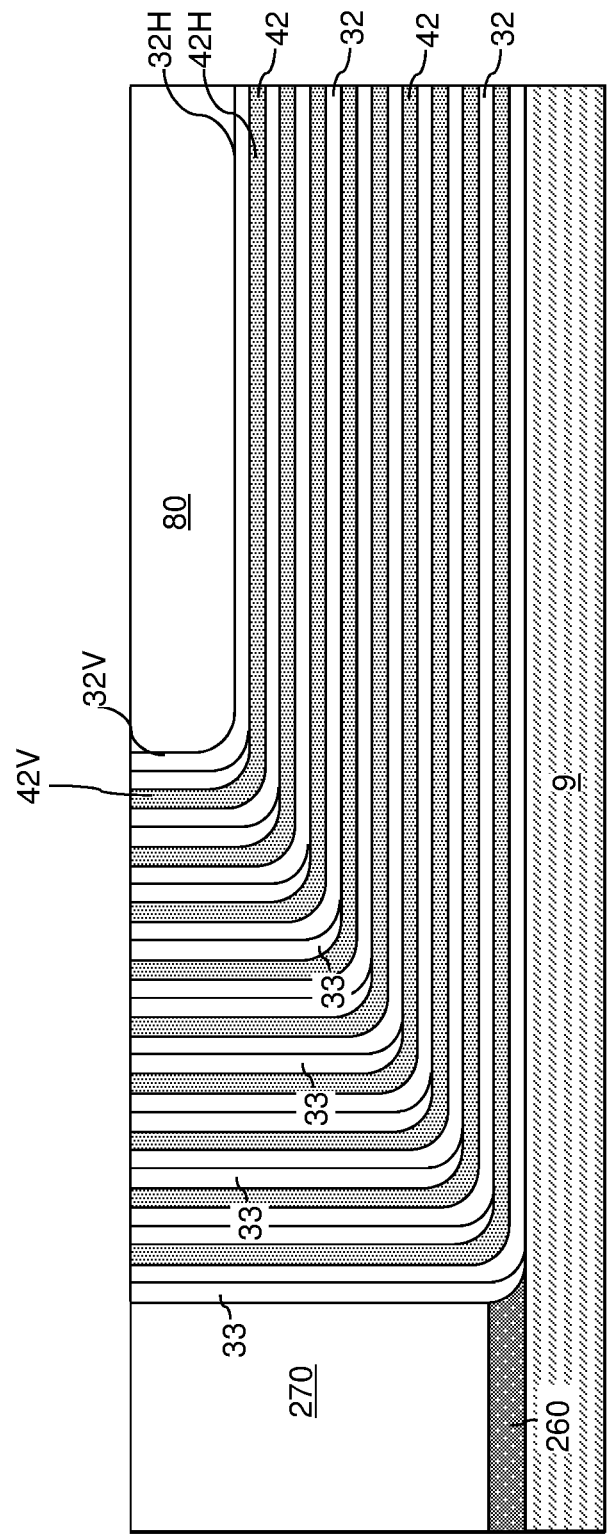
FIG. 12 is a schematic vertical cross-sectional view of the exemplary structure after a planarization process that forms L-shaped insulating layers and L-shaped sacrificial material layers according to an embodiment of the present disclosure.

Referring to FIG. 12, the portions of the planarization dielectric layer 80, the alternating stack (32', 42') and the dielectric spacers 33 interspersed therein, and the planarization stopping structure 280 can be removed from above the horizontal plane including the top surface of the upper template structure 270. In one embodiment, a chemical mechanical planarization process can be performed employing the planarization stopping structure 280 as a stopping structure. Over-polishing can be performed to remove additional portions of the planarization dielectric layer 80 and the alternating stack (32', 42') and the dielectric spacers 33 from above the horizontal plane including the top surface of the upper template structure 270. Alternatively or additionally, a recess etch can be performed instead of, or in addition to, the over-polishing so that the recessed surfaces of the planarization dielectric layer 80 and the alternating stack (32', 42') and the dielectric spacers 33 are substantially coplanar with the top surface of the upper template structure 270. Any remaining portion of the planarization stopping structure 280, if present, can be removed by an etch process, which can be a reactive ion etch process or an isotropic etch process such as a wet etch process.

Generally, portions of the Z-shaped insulating layers 32', the dielectric spacers 33, and the Z-shaped sacrificial material layers 42' can be removed from above the horizontal plane including the top surface of the mesa structure (260, 270) by a planarization process. An alternating stack of L-shaped insulating layers 32 and L-shaped sacrificial material layers 42 is formed over the substrate and on a sidewall of the mesa structure (260, 270). Each L-shaped insulating layer 32 is a remaining portion of a Z-shaped insulating layer 32', and each L-shaped sacrificial material layer 42 is a remaining portion of a Z-shaped sacrificial material layer 42'. Each of the L-shaped insulating layers 32 and the L-shaped sacrificial material layers 42 includes a respective horizontally-extending portion (32H, 42H) and a respective non-horizontally extending portion (32V, 42V) having an angle of 60 to 90 degrees with respect to a horizontal direction, such as a vertically-extending portion. In one embodiment, each horizontally-extending portion has a uniform vertical thickness and each non-horizontally extending portion has a uniform horizontal thickness. The uniform vertical thickness and the uniform horizontal thickness can be the same for each of the L-shaped insulating layers 32 and the L-shaped sacrificial material layers 42. The dielectric spacers 33 are located between neighboring pairs of a vertically-extending portion of an L-shaped insulating layer 32 and a vertically-extending portion of an L-shaped sacrificial material layer 42 after the planarization process.

Figure 13:
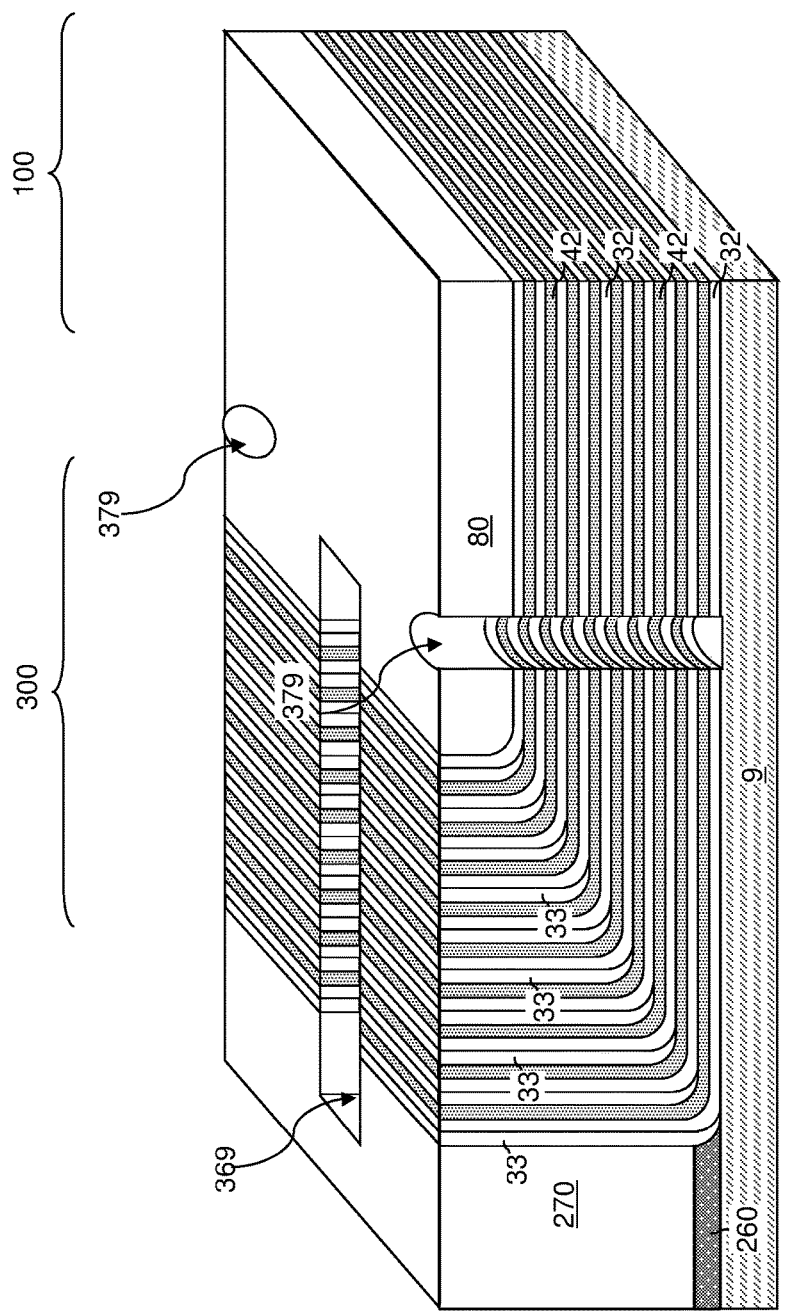
FIG. 13 is a perspective view of the exemplary structure after formation of various support openings according to an embodiment of the present disclosure.

Referring to FIG. 13, a photoresist layer (not shown) can be applied over the exemplary structure, and can be lithographically patterned to form openings therein. The pattern in the photoresist layer can be transferred through the planarization dielectric layer 80, the alternating stack (32, 42) and the dielectric spacers 33, and the mesa structure (260, 270) by an anisotropic etch process. Support openings (369, 379) are formed through the alternating stack (32, 42) and the dielectric spacers 33, and the mesa structure (260, 270). The support openings (369, 379) can include trench-type support openings 369 that laterally extend along a respective lengthwise direction, and cylindrical-type support openings 379 that have a respective generally cylindrical shape.

In one embodiment, at least one of the trench-type support openings 369 can laterally extend through the entire width of the vertically-extending portions of the alternating stack (32, 42) of L-shaped insulating layers 32 and L-shaped sacrificial material layers 42 and the dielectric spacers 33 in the contact region 300. In this case, sidewalls of at least one of the trench-type support openings 369 can include sidewalls of the planarization dielectric layer 80, sidewalls of the horizontally-extending portions (32H, 42H) of the alternating stack (32, 42), sidewalls of the mesa structure (260, 270), and sidewalls of the non-horizontally extending portions (e.g., vertically-extending portions) (32V, 42V) of the alternating stack (32, 42) of L-shaped insulating layers 32 and L-shaped sacrificial material layers 42 and the dielectric spacers 33.

In one embodiment, the cylindrical-type support openings 379 can be formed within a peripheral portion of the contact region 300 and/or a peripheral portion of the memory array region 100. In one embodiment, the sidewalls of the cylindrical-type support openings 379 can consist of sidewalls of the planarization dielectric layer 80, sidewalls of the horizontally-extending portion of the alternating stack (32, 42), and optionally sidewalls of the substrate semiconductor layer 9 if the cylindrical-type support openings 379 extend into the substrate semiconductor layer 9. The photoresist layer can be subsequently removed, for example, by ashing.

Figure 14:
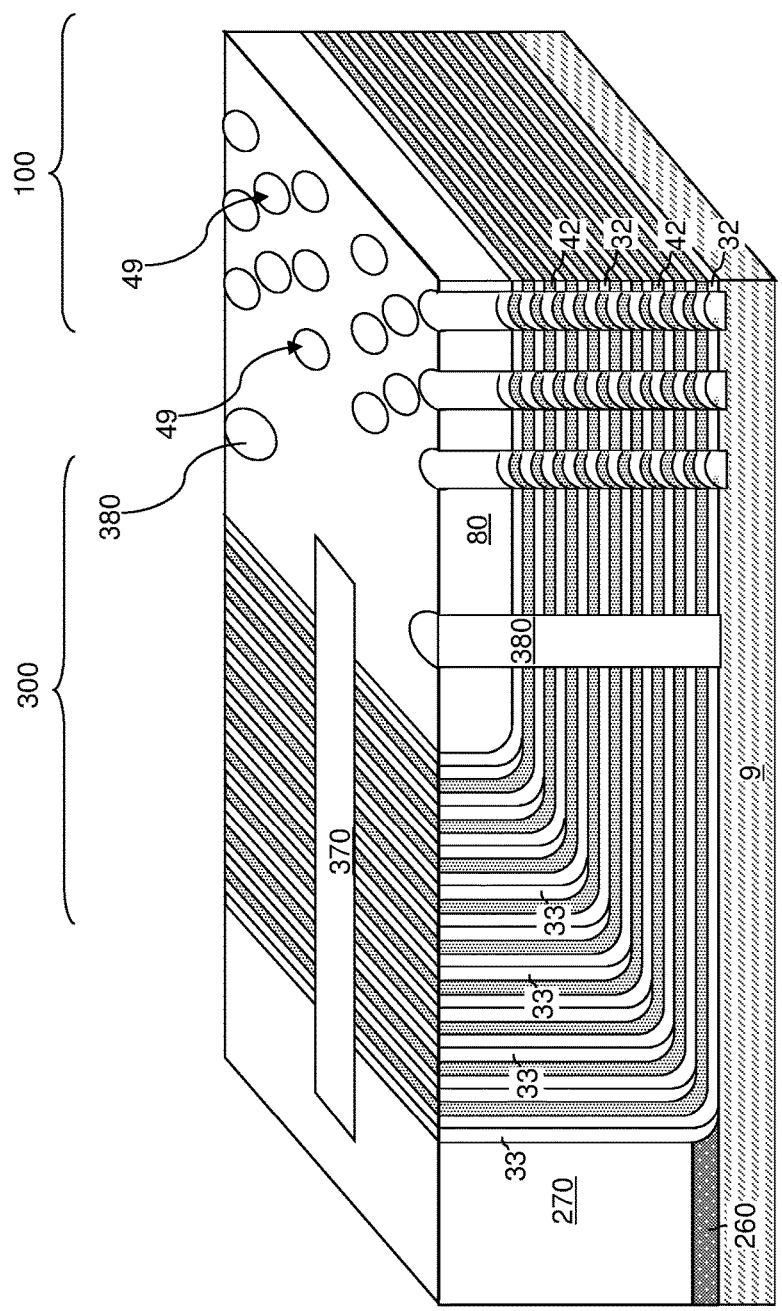
FIG. 14 is a perspective view of the exemplary structure after formation of a first dielectric wall structure and dielectric support pillar structures and formation of memory openings according to an embodiment of the present disclosure.

Referring to FIG. 14, a dielectric material such as silicon oxide is deposited in the support openings (369, 379), for example, by spin-coating or a conformal deposition process. The deposited dielectric material may be removed from above the horizontal plane including the top surface of the planarization dielectric layer 80 by a planarization process, which can employ chemical mechanical planarization and/or a recess etch. Each portion of the deposited dielectric material within a trench-type support opening 369 constitutes a dielectric wall support structure, which is herein referred to as a first dielectric wall structure 370. Each first dielectric wall structure 370 is a support structure including a dielectric material and having a wall configuration, i.e., a pair of parallel sidewalls that horizontally extend along a lengthwise direction. Each portion of the deposited dielectric material within a cylindrical-type support opening 379 is a support structure including a dielectric material, and is herein referred to as a support pillar structure 380. Each of the first dielectric wall structures 370 and the support pillar structures 380 can have straight sidewalls that extend vertically from the top surface of the planarization dielectric layer 80 to the substrate semiconductor layer 9. The first dielectric wall structure 370 are formed through the vertically-extending portions of the L-shaped insulating layers 32 and the L-shaped sacrificial material layers 42 of the alternating stack (32, 42).

Subsequently, a lithographic material stack (not shown) including at least a photoresist layer can be formed over the exemplary structure, and can be lithographically patterned to form openings within the memory array region 100. The pattern in the lithographic material stack can be transferred through the planarization dielectric layer 80 and through horizontally-extending portions of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

Figure 15:
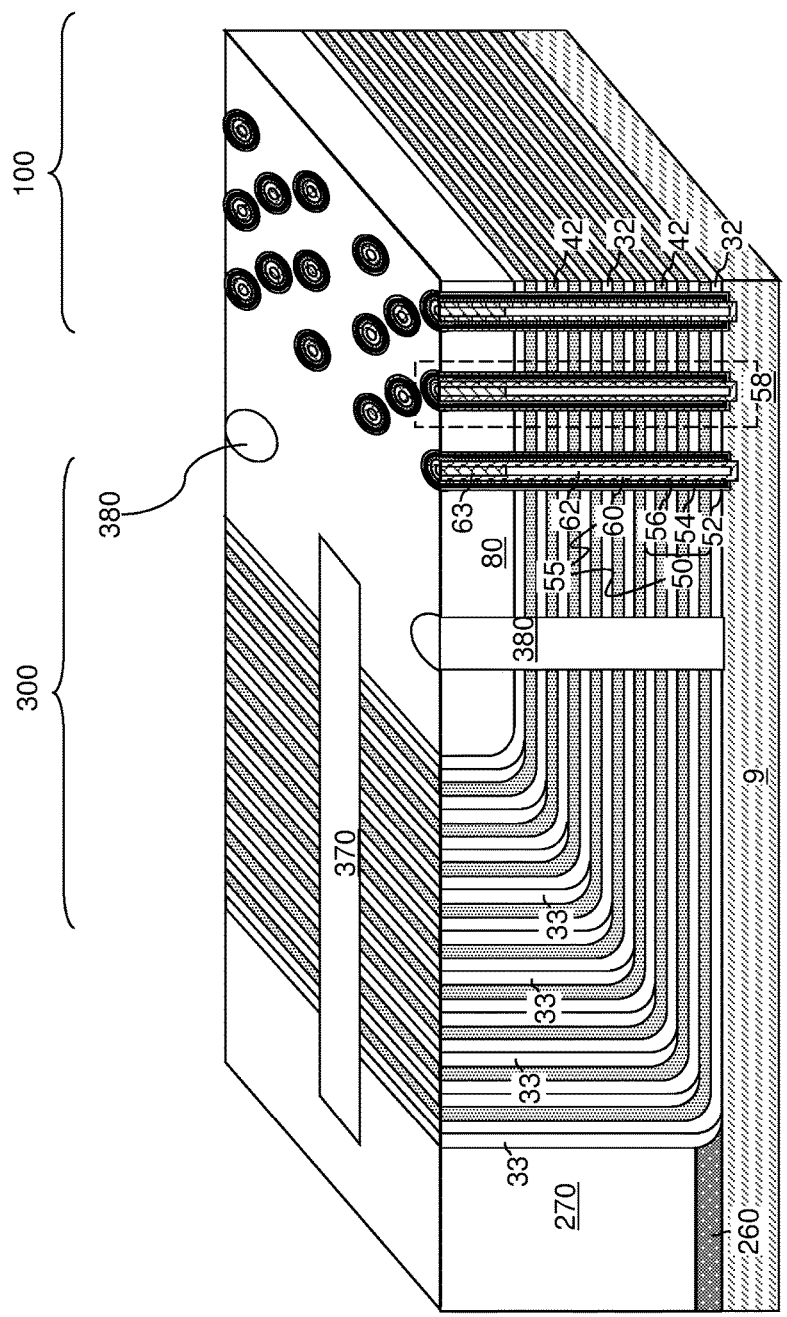
FIG. 15 is a perspective view of the exemplary structure after formation of memory opening fill structures according to an embodiment of the present disclosure.

Referring to FIG. 15, a memory opening fill structure 58 is formed within each memory opening 49. Each memory opening fill structure 58 includes a memory stack structure 55, an optional dielectric core 62, and a drain region 63.

For example, a memory film 50 including a blocking dielectric layer 52, a charge storage layer 54, and a tunneling dielectric layer 56 can be sequentially deposited in each of the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within backside recesses into sacrificial material layers 42. In one embodiment, the charge storage layer 54 includes a silicon nitride layer. In one embodiment, the L-shaped sacrificial material layers 42 and the L-shaped insulating layers 32 can have vertically coincident sidewalls, and the charge storage layer 54 can be formed as a single continuous layer.

In another embodiment, the L-shaped sacrificial material layers 42 can be laterally recessed with respect to the sidewalls of the L-shaped insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer (not expressly shown) may be deposited on the tunneling dielectric. The optional first semiconductor channel layer, the tunneling dielectric layer 56, the charge storage layer 54, and the blocking dielectric layer 52 are sequentially anisotropically etched employing at least one anisotropic etch process. The portions of the optional first semiconductor channel layer, the tunneling dielectric layer 56, the charge storage layer 54, and the blocking dielectric layer 52 located above the top surface of the planarization dielectric layer 80 can be removed by the at least one anisotropic etch process or a chemical mechanical planarization (CMP) process. Further, the horizontal portions of the optional first semiconductor channel layer, the tunneling dielectric layer 56, the charge storage layer 54, and the blocking dielectric layer 52 at a bottom of each memory opening 49 can be removed to form openings in remaining portions thereof. A semiconductor surface of the substrate semiconductor layer 9 can be physically exposed at the bottom of each memory opening 49.

A semiconductor channel material layer can be deposited directly on the semiconductor surface of the substrate semiconductor layer 9. If the optional first semiconductor channel layer is present, then the semiconductor channel material layer comprises a second semiconductor channel layer formed on a surface of the optional first semiconductor channel layer. If the optional first semiconductor channel layer is not present, then the semiconductor channel material layer is formed directly on the tunneling dielectric layer 56. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed. The semiconductor channel material layer may partially or fully fill the cavities in the memory openings 49. Any remaining semiconductor material of the semiconductor channel material layer located above the top surface of the planarization dielectric layer 80 can be removed by a planarization process, which can employ a recess etch or chemical mechanical planarization (CMP). Each remaining portion of the semiconductor channel material layer in the memory openings 49 constitutes a vertical semiconductor channel 60.

In case the cavities in each memory opening 49 are not completely filled by the vertical semiconductor channel 60, a dielectric core layer can be deposited in the cavity to fill any remaining portion of the cavity within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Subsequently, the horizontal portion of the dielectric core layer can be removed, for example, by a recess etch from above the top surface of the planarization dielectric layer 80. Each remaining portion of the dielectric core layer in the memory openings 49 constitutes a dielectric core 62.

Each vertical semiconductor channel 60 formed in the memory openings 49 is a channel of a vertical field effect transistor through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each contiguous set of a blocking dielectric layer 52, a charge storage layer 54, and a tunneling dielectric layer 56 within a memory opening 49 collectively constitutes a memory film 50, which can store electrical charges with a macroscopic retention time.

In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 located within a same memory opening 49 constitutes a memory stack structure 55.

The top surface of each dielectric core 62 can be further recessed within each memory opening, for example, by a recess etch to a depth that is located between the top surface of the planarization dielectric layer 80 and the bottom surface of the planarization dielectric layer 80. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the planarization dielectric layer 80, for example, by chemical mechanical planarization (CMP) or a recess etch to form the drain regions 63. Each combination of a memory film 50 and a vertical semiconductor channel 60 within a memory opening 49 constitutes a memory stack structure 55.

Figure 16:
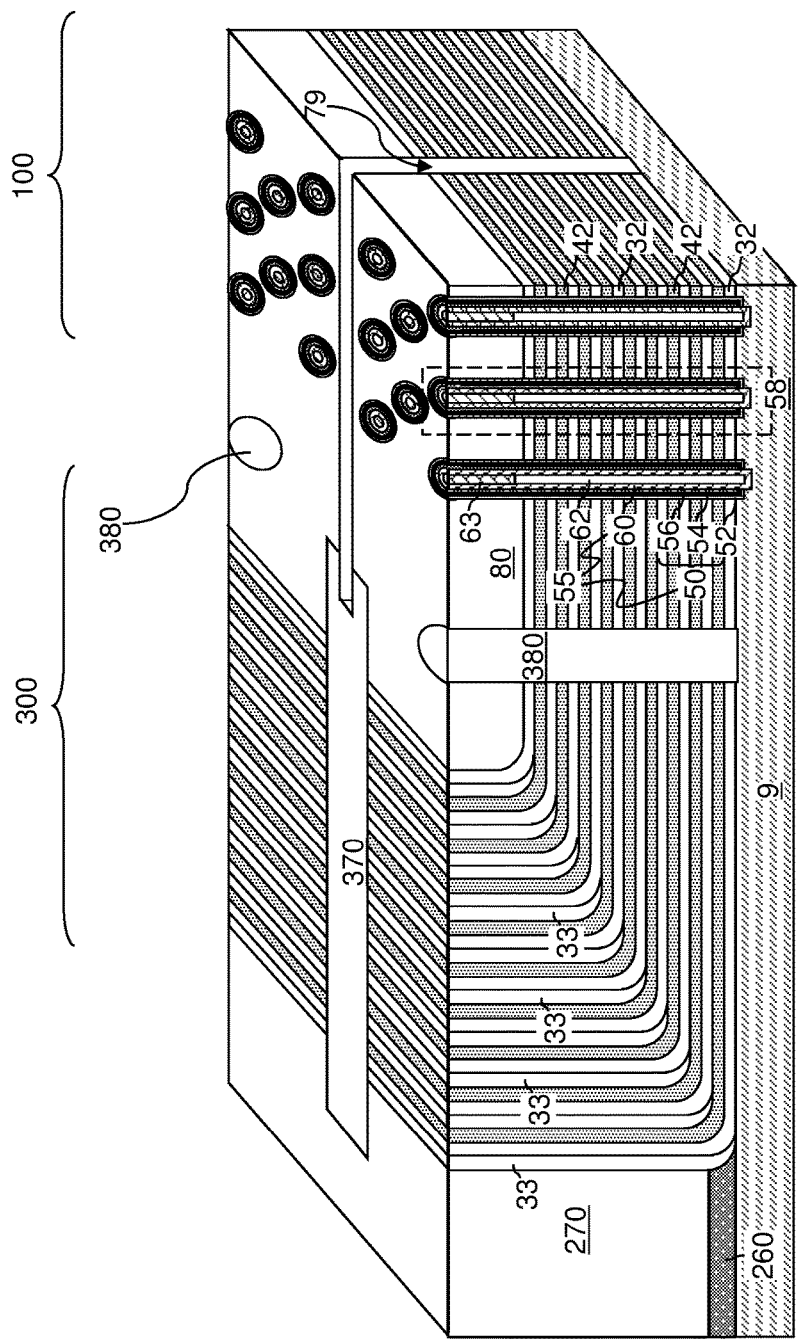
FIG. 16 is a perspective view of the exemplary structure after formation of a backside trench according to an embodiment of the present disclosure.

Referring to FIG. 16, a photoresist layer (not shown) can be applied over the alternating stack (32, 42), and is lithographically patterned to form at least one elongated opening between clusters of memory stack structures 55 within the memory array region 100. The pattern in the photoresist layer can be transferred through the planarization dielectric layer 80 and the alternating stack (32, 42) employing an anisotropic etch to form at least one backside trench 79, which extends at least to the top surface of the substrate semiconductor layer 9. In one embodiment, the at least one backside trench 79 can be adjoined a respective one of the first dielectric wall structures 370. In one embodiment, the at least one backside trench 79 can include a source contact opening in which a source contact via structure can be subsequently formed. The photoresist layer can be subsequently removed, for example, by ashing.

Figure 17:
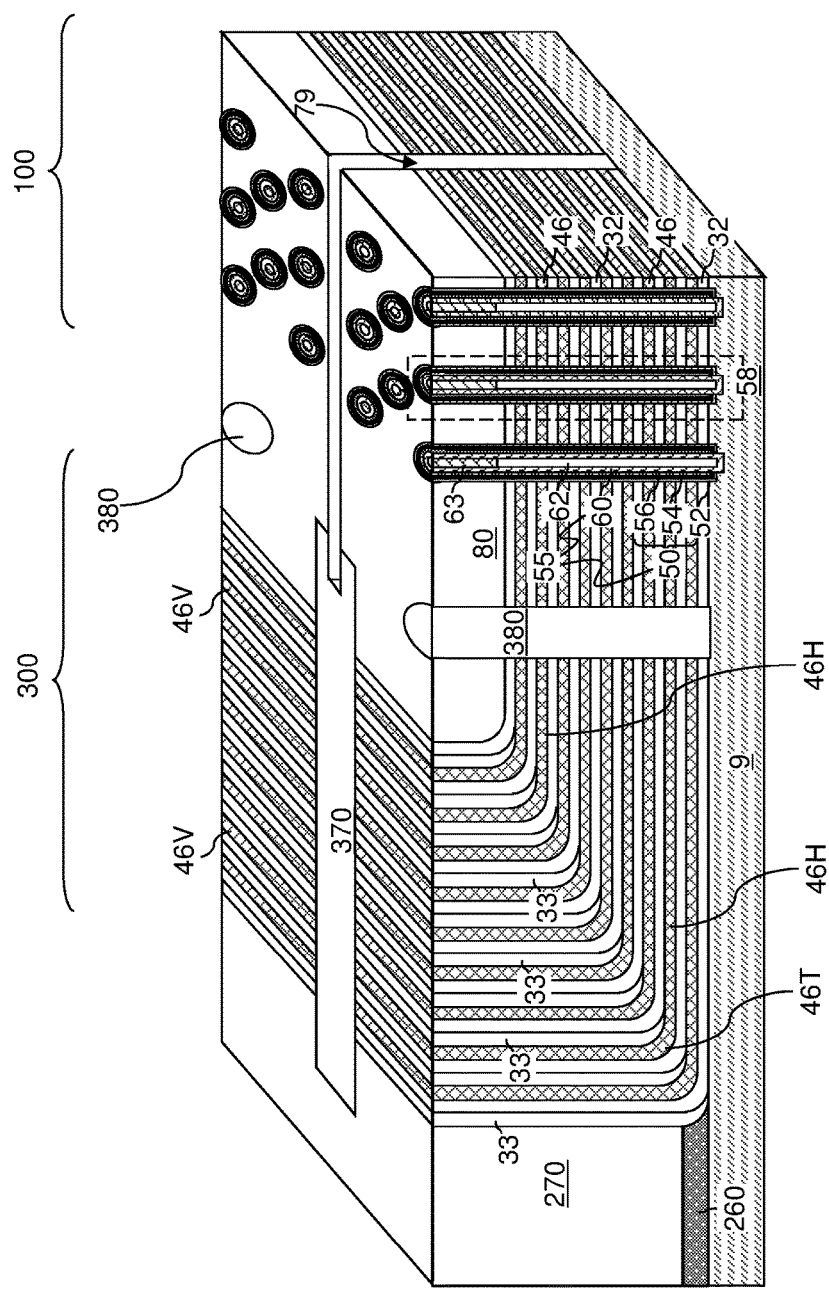
FIG. 17 is a perspective view of the exemplary structure after replacement of L-shaped sacrificial material layer with L-shaped electrically conductive layers according to an embodiment of the present disclosure.

Referring to FIG. 17, the L-shaped sacrificial material layers 46 can be replaced with L-shaped electrically conductive layers 46. For example, an etchant that selectively etches the material of the L-shaped sacrificial material layers 42 with respect to the material of the L-shaped insulating layers 32 can be introduced into the at least one backside trench 79, for example, employing an etch process. Backside recesses are formed in volumes from which the L-shaped sacrificial material layers 42 are removed. The removal of the material of the L-shaped sacrificial material layers 42 can be selective to the material of the L-shaped insulating layers 32, the semiconductor material of the substrate semiconductor layer 9, and the material of the outermost layer of the memory films 50. In one embodiment, the L-shaped sacrificial material layers 42 can include silicon nitride, and the L-shaped insulating layers 32 include silicon oxide.

The etch process that removes the material selective to the material and the outermost layer of the memory films 50 can be a wet etch process employing a wet etch solution, or can be a gas phase (dry) etch process in which the etchant is introduced in a vapor phase into the at least one backside trench 79. For example, if the L-shaped sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The first dielectric wall structures 370, the support pillar structures 380, and the memory stack structures 55 provide structural support to prevent collapse of the L-shaped insulating layers 32 while the backside recesses are present within volumes previously occupied by the L-shaped sacrificial material layers 42.

Each backside recess can include a horizontally-extending portion and a non-horizontally-extending portion, which may extend vertically or substantially vertically. Each backside recess extends to the horizontal plane including the top surface of the planarization dielectric layer 80, the top surface of the mesa structure (260, 270), and the top surfaces of the first dielectric wall structures 370 and the support pillar structures 380. A plurality of backside recesses can be formed in the volumes from which the material of the L-shaped sacrificial material layers 42 is removed. The memory openings in which the memory stack structures 55 are formed are herein referred to as front side openings or front side cavities in contrast with the backside recesses. In one embodiment, the memory array region 100 comprises an array of monolithic three-dimensional NAND strings having a plurality of device levels disposed above the substrate semiconductor layer 9. In this case, each backside recess can define a space for receiving a respective word line of the array of monolithic three-dimensional NAND strings.

Each horizontally-extending portion of the backside recesses can extend substantially parallel to the top surface of the substrate semiconductor layer 9. Each horizontally-extending portion of the backside recesses can be vertically bounded by a top surface of an underlying insulating layer 32 and a bottom surface of an overlying insulating layer 32. In one embodiment, each horizontally-extending portion of the backside recesses can have a uniform height throughout.

Each non-horizontally-extending portion of the backside recesses can extend at an angle of 60 to 90 degrees with respect to a horizontal direction, such as vertically or substantially vertically (e.g., within 5 degrees of vertical). Each non-horizontally-extending portion of the backside recesses can be laterally bounded by a sidewall of a vertically-extending portion of an L-shaped insulating layer 32 and a sidewall of a dielectric spacer 33 (if present). In one embodiment, each non-horizontally-extending portion of the backside recesses can have a uniform width throughout, which can be the same as the uniform height of an adjoining horizontally-extending portion of the same backside recess.

Optionally, a backside blocking dielectric layer (not shown) can be optionally formed. The backside blocking dielectric layer, if present, comprises a dielectric material that functions as a control gate dielectric for the control gates to be subsequently formed in the backside recesses. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the backside recesses and on a sidewall of the backside trench 79. The backside blocking dielectric layer can be formed directly on horizontal surfaces of the L-shaped insulating layers 32 and sidewalls of the memory stack structures 55 within the backside recesses. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conductive material is deposited within the backside recesses to form electrically conductive layers 46. The at least one conductive material deposited in the at least one backside trench 79 and over the planarization dielectric layer 80 constitutes a continuous conductive material layer (not shown) that is subsequently removed. A backside cavity is present within each backside trench 79. The at least one conductive material can include, for example, a metallic liner material such as a conductive metal nitride (e.g., TiN, TaN, or WN) and a metallic fill material that consists essentially of at least one metal. The metallic fill material can consist essentially of a single elemental metal (such as Cu, Co, W, or Al) or an intermetallic alloy of at least two elemental metals. In one embodiment, the at least one conductive material can include a titanium nitride liner and a tungsten fill material. The at least one conductive material can be deposited by a conductive deposition process such as chemical vapor deposition (CVD) and/or atomic layer deposition (ALD). The at least one conductive material fills each of the backside recesses. Each continuous portion of the deposited at least one conductive material located within a backside recess constitutes an electrically conductive layer 46. Each electrically conductive layer 46 can include an optional metallic liner portion that include the metallic liner material and a metallic fill portion that includes the metallic fill material.

The continuous conductive material layer (i.e., the continuous portion of the at least one conductive material deposited in the at least one backside trench 79 or over the horizontal plane including the top surfaces of the planarization dielectric layer 80 and the mesa structure (260, 270)) can be removed by an etch process, which may be an isotropic etch process. Each of the L-shaped electrically conductive layers 46 comprises a respective continuously-extending conductive material portion of a homogeneous composition that includes a respective horizontally-extending portion 46H that extend parallel to the top surface of the substrate semiconductor layer 9 and a respective non-horizontally-extending portion (such as a vertically extending portion) 46V that extends parallel to the at least one sidewall of the mesa structure (260, 270). In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270). As used herein, a "continuously-extending" element or an "integral" refers to an element that consists of a single continuous structure such that each point within the structure can be connected to any other point within the structure by a line that is contained entirely within the volume of the structure. As used herein, a "homogeneous composition" refers to a composition that is the same throughout the entirety of an element.

Specifically, each metallic liner portion within the L-shaped electrically conductive layers 46 is a continuously-extending conductive material portion of a homogeneous composition that includes a respective horizontally-extending portion 46H that extend parallel to the top surface of the substrate semiconductor layer 9 and a respective non-horizontally-extending portion 46V that extend parallel to the at least one sidewall of the mesa structure (260, 270). Further, each metallic fill portion within the L-shaped electrically conductive layers 46 is a continuously-extending conductive material portion of a homogeneous composition that includes a respective horizontally-extending portion that extend parallel to the top surface of the substrate semiconductor layer 9 and a respective non-horizontally-extending portion that extend parallel to the at least one sidewall of the mesa structure (260, 270). Each of the continuously-extending conductive material portions, as embodied as a metallic liner portion or as a metallic fill portion, is free of any physical interface therein. As used herein, a "physical interface" in an element refers to a region including at least one physically observable inhomogeneity therein such as an interfacial compositional change or an interfacial microstructural change.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 18:
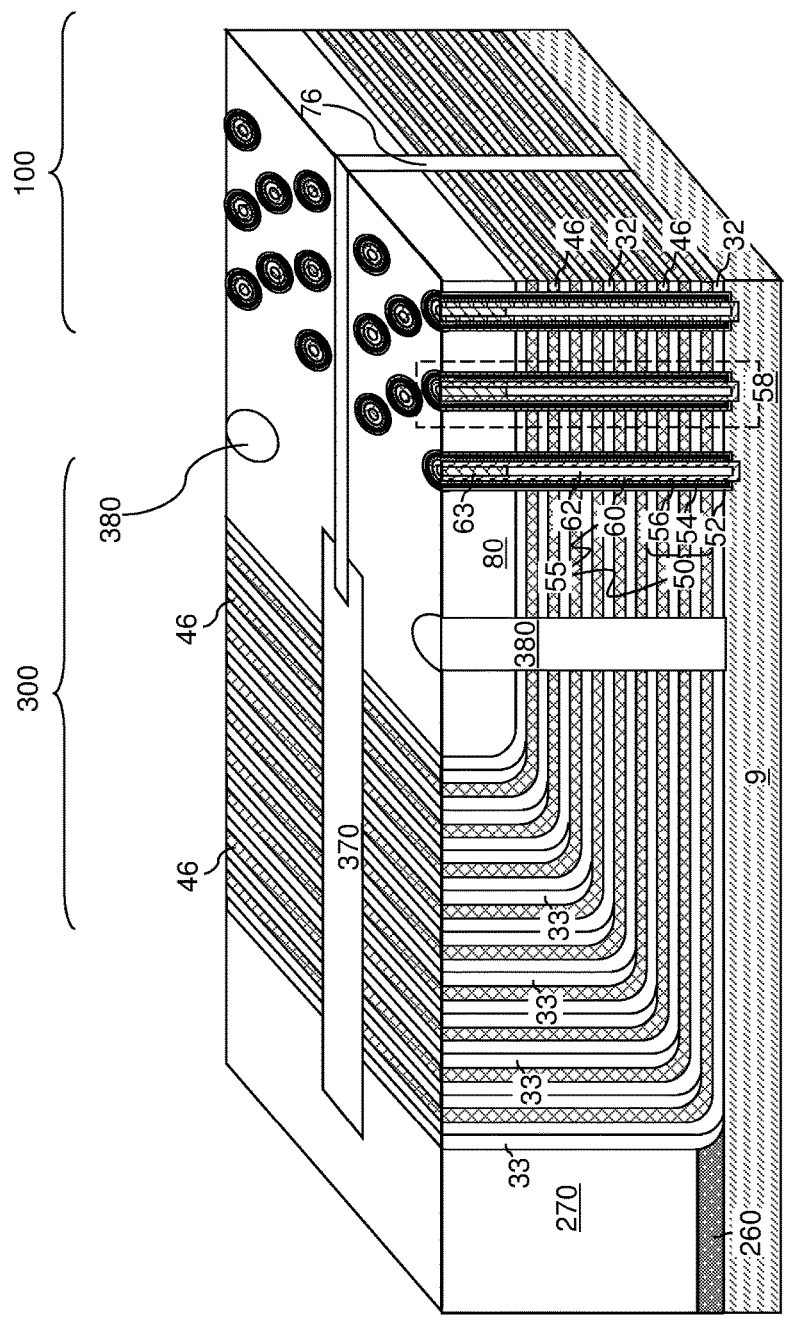
FIG. 18 is a perspective view of the exemplary structure after formation of a second dielectric wall structure according to an embodiment of the present disclosure.

Referring to FIG. 18, a dielectric material such as doped silicate glass or undoped silicate glass can be deposited in the at least one backside trench 79 by a conformal deposition process such as chemical vapor deposition. Excess portions of the deposited dielectric material may, or may not, be removed from above the top surface including the top surface of the planarization dielectric layer 80. A second dielectric wall structure 76 is formed within each of the at least one backside trench 79. Each second dielectric wall structure 76 is formed through the horizontally-extending portions of the L-shaped insulating layers 32 and the L-shaped electrically conductive layers 46, which form an alternating stack (32, 46). In one embodiment, a second dielectric wall structure 76 can contact a sidewall of a first dielectric wall structure 370. In an alternative embodiment, a source region is implanted through the backside trench 79 into the substrate semiconductor layer 9, and the dielectric wall structure 370 comprises a dielectric spacer. In this alternative embodiment, an electrically conductive source line or source electrode is formed inside the dielectric wall structure 370 in contact with the source region.

Figure 19:
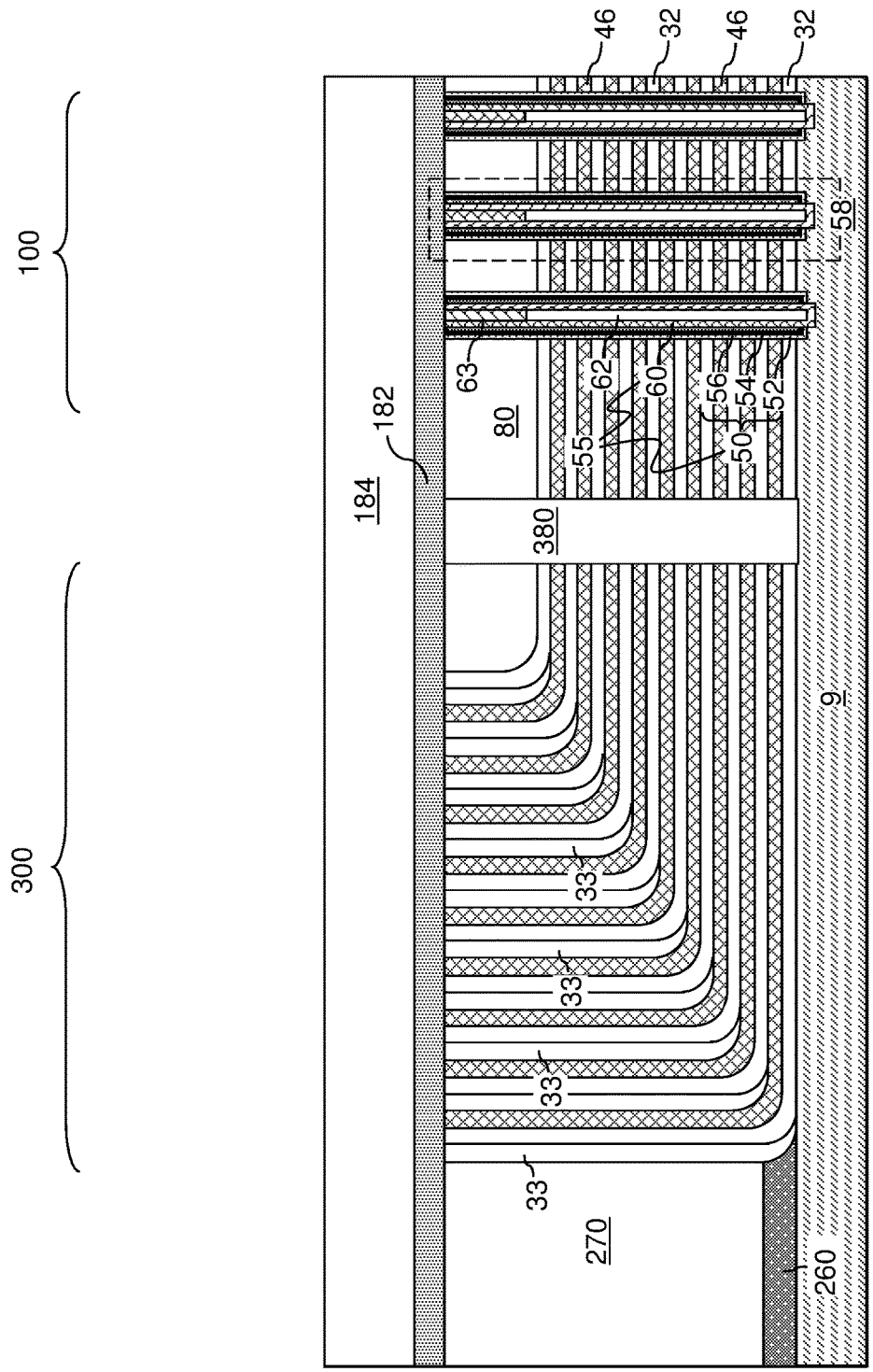
FIG. 19 is a vertical cross-sectional view of the exemplary structure after formation of at least one contact level dielectric layer according to an embodiment of the present disclosure.

Referring to FIG. 19, at least one contact level dielectric layer (182, 184) can be formed over the top surface of the planarization dielectric layer 80, over the vertically-extending portions of the alternating stack (32, 46) and the optional dielectric spacers 33, and the mesa structure (260, 270). In case the dielectric material that fills the at least one backside trench is not removed, an additional dielectric material layer may be present between the planarization dielectric layer 80 and the at least one contact level dielectric layer (182, 184). Alternatively, a horizontal portion of the dielectric material that fills the at least one backside trench may remain over the planarization dielectric layer 80, and may be employed in lieu of all, or a part of, the at least one contact level dielectric layer (182, 184).

In an illustrative example, the at least one contact level dielectric layer (182, 184) can include a first contact level dielectric layer 182 and a second contact level dielectric layer 184. The first contact level dielectric layer 182 can include silicon nitride, and can have a thickness in a range from 10 nm to 100 nm. The second contact level dielectric layer 184 can include silicon oxide, and can have a thickness in a range from 100 nm to 1,000 nm.

Figure 20:
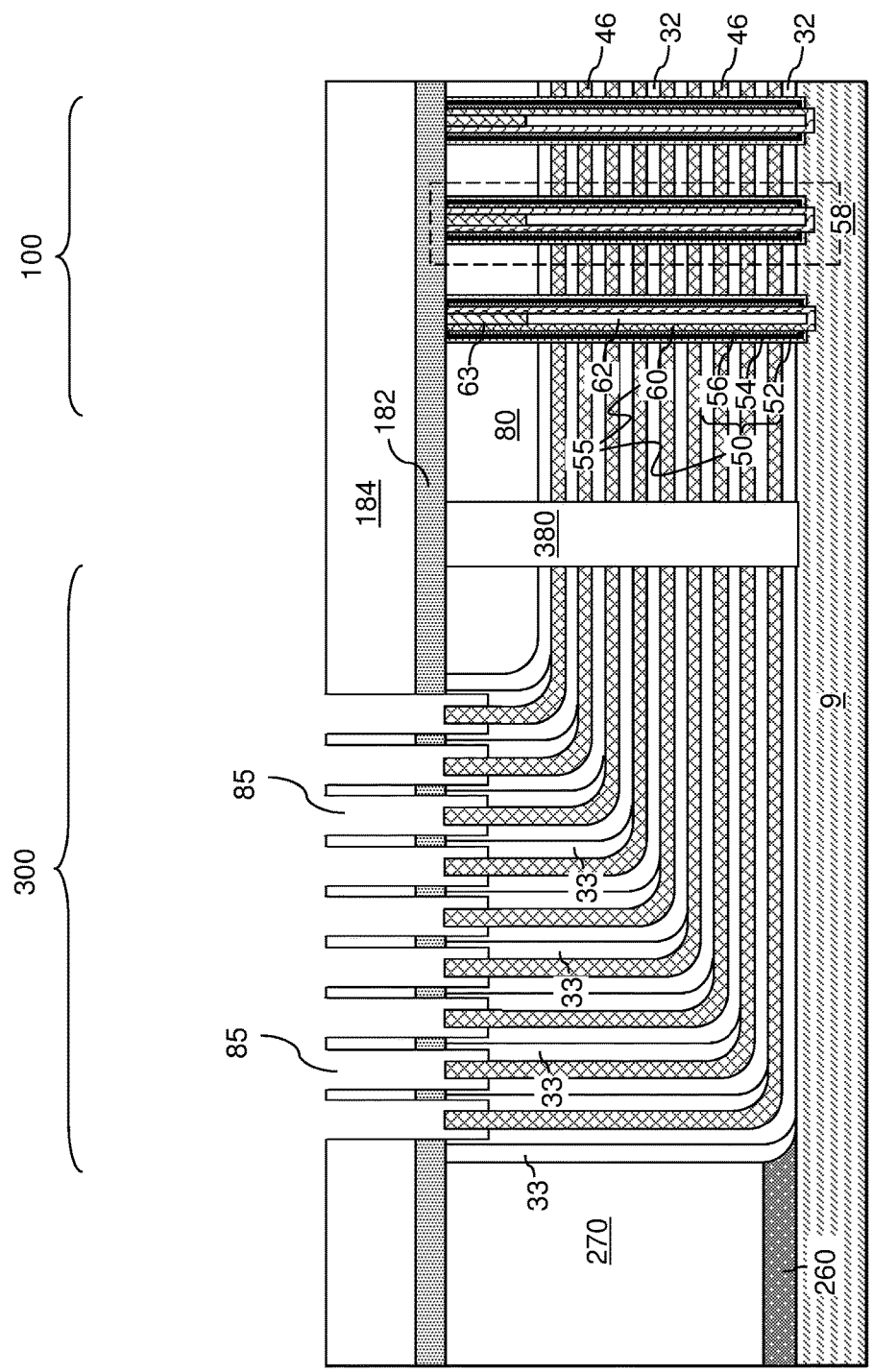
FIG. 20 is a vertical cross-sectional view of the exemplary structure after formation of word line contact via cavities according to an embodiment of the present disclosure.

Referring to FIG. 20, a photoresist layer (not shown) can be applied over the at least one contact level dielectric layer (182, 184), and can be lithographically patterned to form openings in the contact region 300. The openings in the photoresist layer can be formed in areas that overlie the vertically-extending portions of the L-shaped electrically conductive layers 46. The pattern in the photoresist layer can be transferred through the at least one contact level dielectric layer (182, 184) and optionally partly through the vertically-extending portions of the L-shaped insulating layers 32 and the dielectric spacers 33. Contact via cavities are formed through the at least one contact level dielectric layer (182, 184) and into upper regions of the vertically-extending portions of the L-shaped insulating layers 32 and the dielectric spacers 33. The contact via cavities are herein referred to as word line contact via cavities 85.

At least a top surface of a respective one of the non-horizontally extending portions, such as vertically-extending portions of the L-shaped electrically conductive layers 46 is physically exposed at a bottom of each of the word line contact via cavities 85. The lateral dimensions of the word line contact via cavities 85 can be greater than the lateral thickness of the non-horizontally extending portions, such as vertically-extending portions of the L-shaped electrically conductive layers 46 along the direction of alternation of the non-horizontally extending portions, such as vertically-extending portions of the L-shaped insulating layers 32 and the L-shaped electrically conductive layers 46. In this case, a pair of sidewalls of the respective one of the non-horizontally extending portions, such as vertically-extending portions of the L-shaped electrically conductive layers 46 can be physically exposed within each of the word line contact via cavities 85. Further, a sidewall of a non-horizontally extending portion, such as vertically-extending portion of an L-shaped insulating layer 32 and a sidewall of a dielectric spacer 33 (or another insulating layer 32 if the dielectric spacer 33 is omitted) can be physically exposed at the bottom of each of the word line contact via cavities 85. The photoresist layer can be subsequently removed, for example, by ashing.

Figure 21:
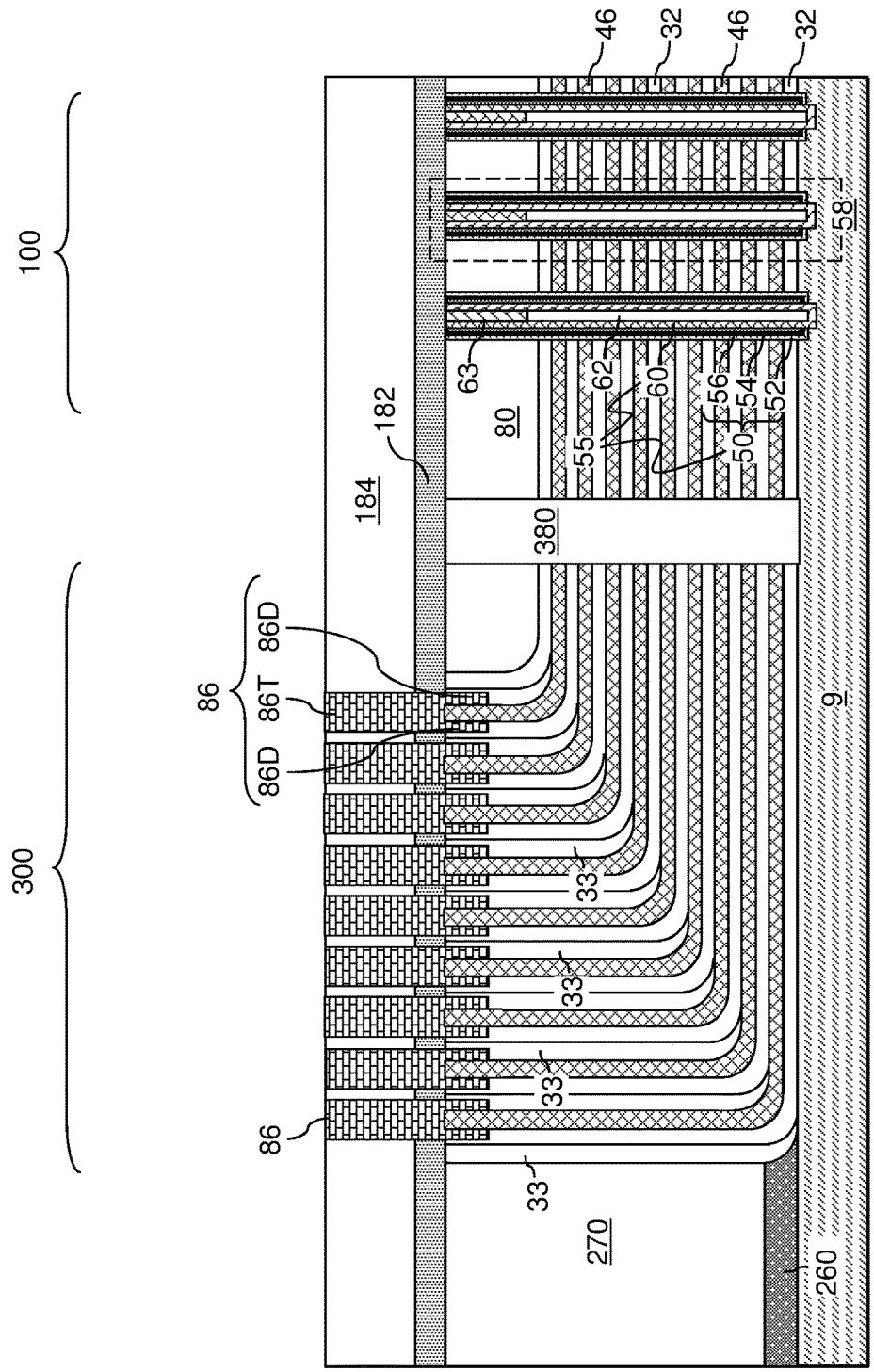
FIG. 21 is a vertical cross-sectional view of the exemplary structure after formation of contact via structures according to an embodiment of the present disclosure.

Referring to FIG. 21, at least one conductive material can be deposited in each of the word line contact via cavities 85. The at least one conductive material can include, for example, an optional metallic nitride liner material (such as TiN) and a metallic fill material (such as copper or tungsten). Excess portions of the at least one conductive material can be removed from above the top surface of the at least one contact level dielectric layer (182, 184) by a planarization process such as a recess etch. Each remaining portion of the at least one conductive material in the word line contact via cavities 85 constitutes a contact via structure, which is herein referred to as a word line contact via structure 86.

Each word line contact via structure 86 on a respective one of non-horizontally extending portions, such as vertically-extending portions of the L-shaped electrically conductive layers 46. One of more of the contact via structures 86 can include a respective pair of downward-protruding portions 86D that straddle and contact sidewalls of a respective one of the non-horizontally extending portions, such as vertically-extending portions 46V of the L-shaped electrically conductive layers 46. The respective pair of downward-protruding portions 86D contacts a sidewall of one of the dielectric spacers 33 and a sidewall of one of the non-horizontally extending portions 32V, such as vertically-extending portions of the L-shaped insulating layers 32. In an alternative embodiment, if the dielectric spacer 33 is omitted, then respective pair of downward-protruding portions 86D contacts sidewalls of a pair of nearest neighbor non-horizontally extending portions 32V of the L-shaped insulating layers 32. A top portion 86T of the word line contact via structure 86 joins portions 86D and contacts the top surface of the non-horizontally extending portions 46V of the electrically conductive layers 46. In some embodiments, the word line contact via structures 86 can have the same height thereamongst, which can be greater than the total thickness of the at least one contact level dielectric layer (182, 184).

Figure 22A:
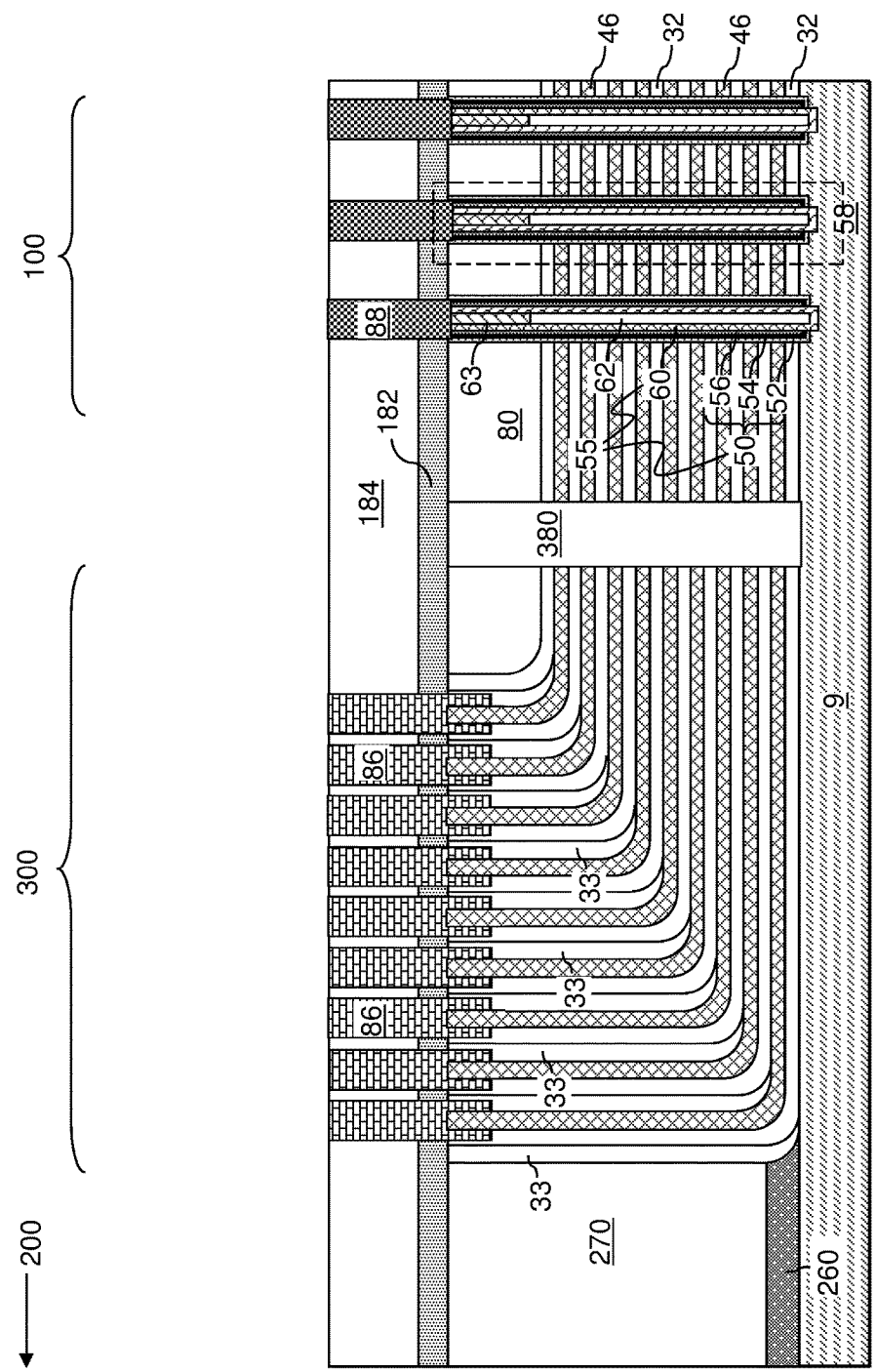
FIG. 22A is a vertical cross-sectional view of the exemplary structure after formation of array contact via structures according to an embodiment of the present disclosure.
Figure 22B:
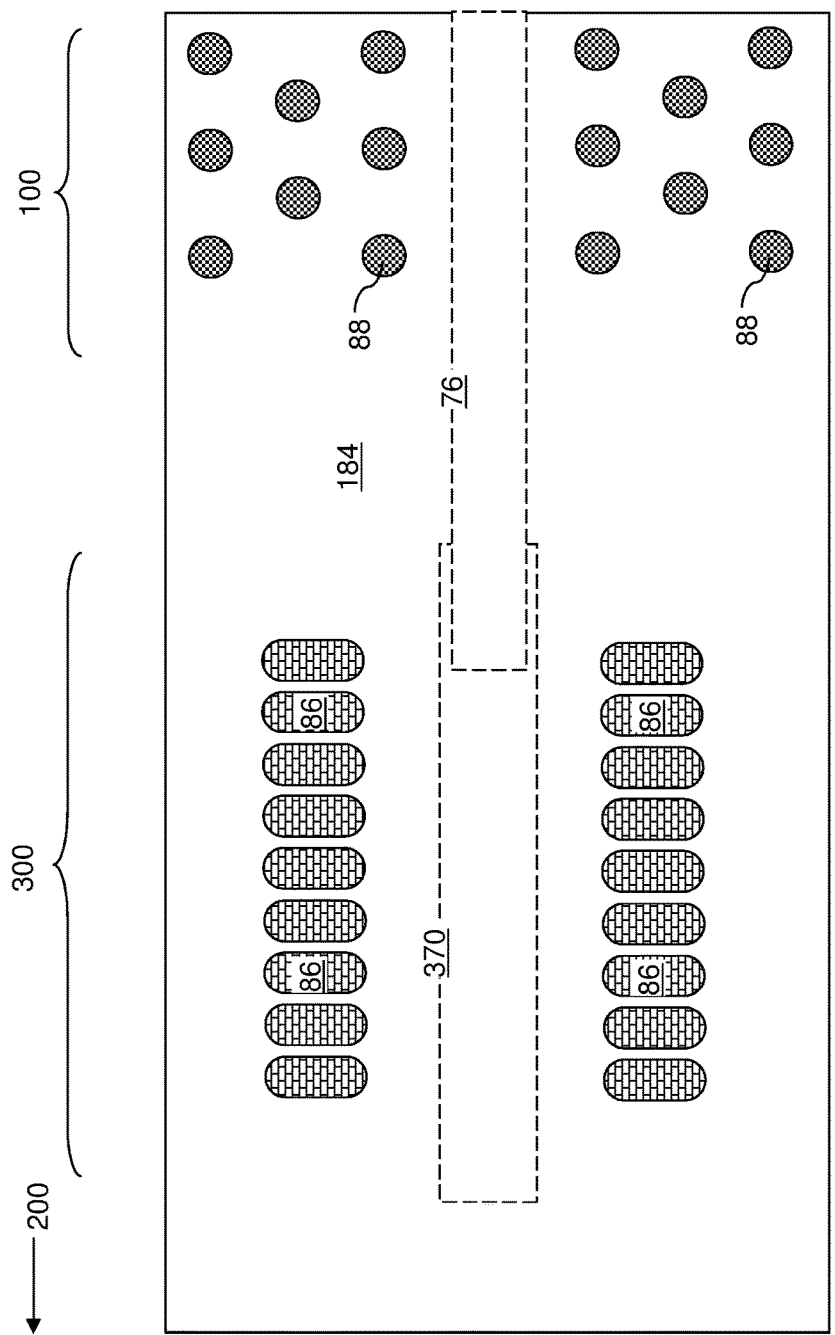
FIG. 22B is a top-down view of the exemplary structure of FIG. 22A. The plane A-A' is the plane of the cross-section of FIG. 22A.

Referring to FIGS. 22A and 22B, additional contact via structures such as array contact via structures 88 and peripheral device contact via structures (not shown) that contact peripheral devices in the peripheral device region 200 can be formed. The array contact via structures 88 can extend through the at least one contact level dielectric layer (182, 184), and can contact a top surface of a respective one of the drain regions 63. Additional dielectric material layers (not shown) and additional metal interconnect structures (not shown) can be formed above the at least one contact level dielectric layer (182, 184). In one embodiment, the word line contact via structures 86 may be arranged as linear arrays that extend along the horizontal direction that is the same as the thickness direction of the vertically-extending portions of the alternating stack (32, 46).

Figure 23:
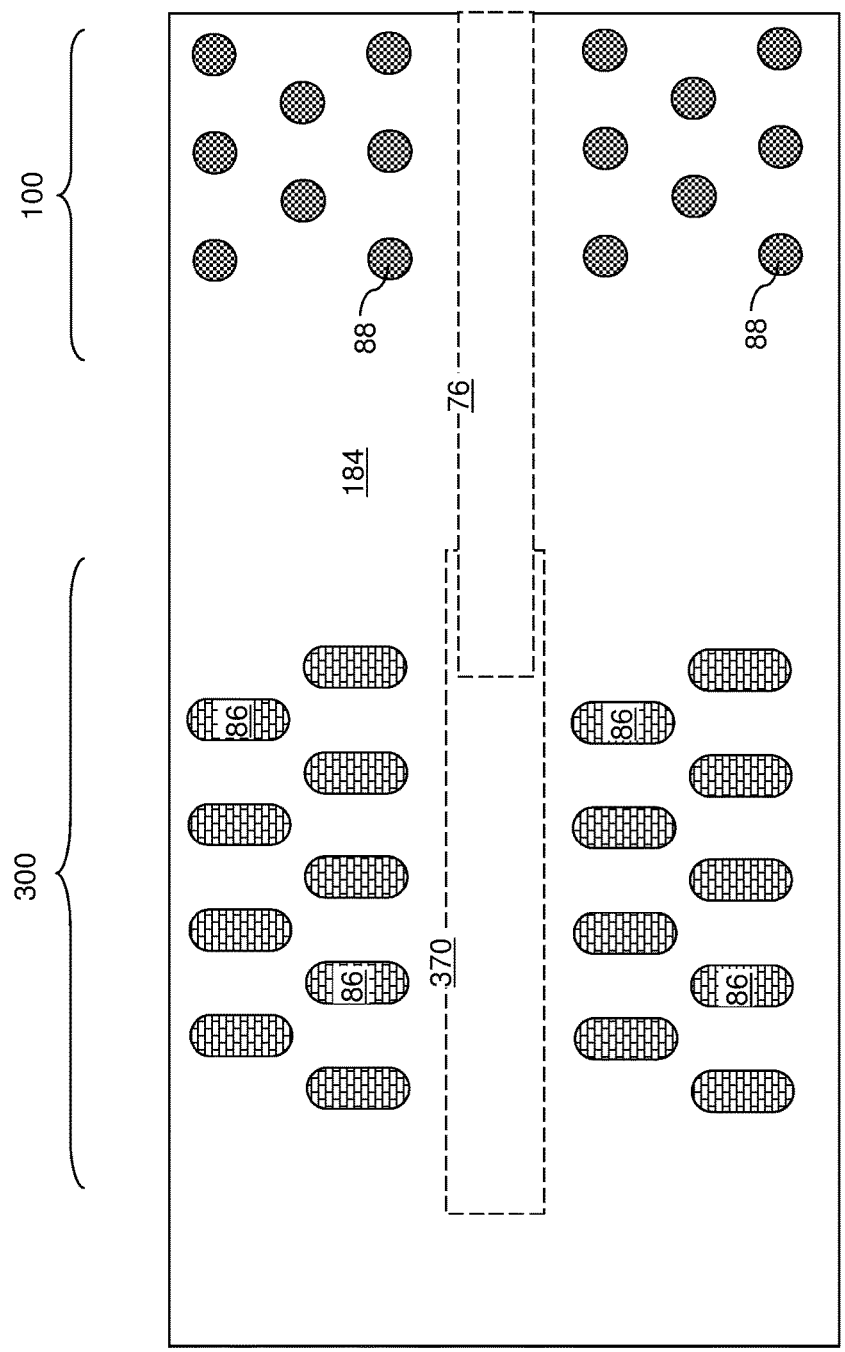
FIG. 23 is a top-down view of an alternative embodiment of the exemplary structure.

Referring to FIG. 23, an alternative embodiment of the exemplary structure is illustrated, which can be derived from the exemplary structure of FIGS. 22A and 22B by forming the word line contact via structures 86 as staggered arrays in which each group of word line contact via structures 86 is arranged in multiple rows.

Referring generally to all drawings of the present disclosure, a three-dimensional memory device includes an alternating stack of L-shaped insulating layers 32 and L-shaped electrically conductive layers 46 located over a top surface 7 of a substrate 9, such that each of the L-shaped insulating layers 32 and the L-shaped electrically conductive layers 46 includes a respective horizontally-extending portion (32H, 46H) and a respective non-horizontally-extending portion (32V, 46V). Memory stack structures 55 extend through a memory array region 100 of the alternating stack (32, 46) that includes the horizontally-extending portions 32H of the L-shaped electrically conductive layers. Each of the memory stack 55 structures includes a memory film 50 and a vertical semiconductor channel 60. Optional dielectric spacers 33 can be added such that they non-horizontally extend between neighboring pairs of a non-horizontally-extending portion 32V of an L-shaped insulating layer 32 and a non-horizontally-extending portion 46V of an L-shaped electrically conductive layer 46. Contact via structures 86 contact a respective one of the non-horizontally-extending portions 46V of the L-shaped electrically conductive layers 46.

In one embodiment, each respective non-horizontally-extending portion (32V, 46V) of the L-shaped insulating layers 32 and the L-shaped electrically conductive layers 46 extends at angle of 60 to 90 degrees with respect to a horizontal direction which is parallel to the top surface 7 of the substrate 9. In a non-limiting example, each respective non-horizontally-extending portion (32V, 46V) of the L-shaped insulating layers 32 and the L-shaped electrically conductive layers 46 comprise vertically-extending portions (32V, 46V).

In one embodiment, each respective horizontally-extending portion (32H, 46H) has a uniform vertical thickness and each respective vertically-extending portion (32V, 46V) has a uniform horizontal thickness.

In another embodiment, a mesa structure (260, 270) is located over the substrate 9. Each respective non-horizontally-extending portion (32V, 46V) of the L-shaped insulating layers 32 and the L-shaped electrically conductive layers 46 is located over a sidewall of the mesa structure.

In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270).

In one embodiment, the horizontally-extending portions of the L-shaped electrically conductive layers 46 contact a bottom surface of a respective overlying one of the horizontally-extending portions of the L-shaped insulating layers 32 and a top surface of a respective underlying one of the horizontally-extending portions of the L-shaped insulating layers 32.

In one embodiment, a plurality of the vertically-extending portions of the L-shaped electrically conductive layers 46 contacts a sidewall of a respective one of the L-shaped insulating layers 32 and a sidewall of a respective one of the dielectric spacers 33. In one embodiment, the dielectric spacers 33 have a lateral width that is in a range from 50% to 400% of an average lateral width of the vertically-extending portions of the L-shaped insulating layers 32.

In one embodiment, the contact via structures 86 contact a pair of sidewalls of the respective one of the vertically-extending portions of the L-shaped electrically conductive layers 46. In one embodiment, the contact via structures 86 straddle the respective one of the vertically-extending portions of the L-shaped electrically conductive layers 46 and include a respective pair of downward-protruding portions. In one embodiment, the respective pair of downward-protruding portions contacts a sidewall of one of the dielectric spacers 33 and a sidewall of one of the vertically-extending portions of the L-shaped insulating layers 32.

In one embodiment, at least one contact level dielectric layer (182, 184) can overlie the memory stack structures 55, the vertically-extending portions of the L-shaped insulating layers 32, and the L-shaped electrically conductive layers 46, wherein the contact via structures 86 extend through the at least one contact level dielectric layer (182, 184). In one embodiment, the contact via structures 86 have a same height that is greater than a total thickness of the at least one contact level dielectric layer (182, 184).

In one embodiment, the three-dimensional memory device can comprise: a first dielectric wall structure 370 vertically extending through the vertically-extending portions of the L-shaped insulating layers 32 and the L-shaped electrically conductive layers 46 of the alternating stack (32, 46); and a second dielectric wall structure 76 vertically extending through the horizontally-extending portions of the L-shaped insulating layers 32 and the L-shaped electrically conductive layers 46 of the alternating stack (32, 46).

In one embodiment, the three-dimensional memory structure comprises a vertical NAND memory device. The L-shaped electrically conductive layers 46 can comprise, or can be electrically connected to, a respective word line of the monolithic three-dimensional NAND memory device. The substrate semiconductor layer 9 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of a charge storage layer 54 at a level of another electrically conductive layer 46) in a second device level of the array of monolithic three-dimensional NAND strings. The silicon substrate can contain an integrated circuit comprising a driver circuit for the memory device located thereon. The L-shaped electrically conductive layers 46 can comprise a plurality of control gate electrodes having a strip shape extending substantially parallel to the top surface of the substrate semiconductor layer 9, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate semiconductor layer 9; and a plurality of charge storage elements (as embodied as portions of the charge storage layer 54 that are located at each level of the L-shaped electrically conductive layers 46). Each charge storage element can be located adjacent to a respective one of the plurality of vertical semiconductor channels 60.

The various embodiments of the present disclosure provide schemes for formatting an alternating stack of the L-shaped insulating layers 32 and the L-shaped electrically conductive layers 46 such that end portions 46V of the L-shaped electrically conductive layers 46 extend along a non-horizontal (e.g., vertical) direction and provide top surfaces within a same horizontal plane that may be at the height of the top surfaces of drain regions 63 that are formed in the memory array region 100. The L-shaped electrically conductive layers 46 including non-horizontally extending portions 46V function as angled word lines that facilitate formation of word line contact via structures 86 thereupon. Thus, formation of staircases or a terrace region in which electrically conductive layers 46 extent to different lateral extents is not necessary. By eliminating the need to form a terrace region, the various embodiments of the present disclosure can simplify the process flow for manufacture of word line contact via structures 86, and thus, reduce the manufacturing cost and/or enhance the yield and/or reliability of the word line contact via structures 86 of a three-dimensional memory device Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of L-shaped insulating layers and L-shaped electrically conductive layers located over a top surface of a substrate, wherein each of the L-shaped insulating layers and the L-shaped electrically conductive layers includes a respective horizontally-extending portion and a respective non-horizontally-extending portion;
memory stack structures extending through a memory array region of the alternating stack that includes the horizontally-extending portions of the L-shaped electrically conductive layers, wherein each of the memory stack structures comprises a memory film and a vertical semiconductor channel;
dielectric spacers non-horizontally extending between neighboring pairs of each one of a non-horizontallyextending portion of an L-shaped insulating layer and each one of a non-horizontally-extending portion of an L-shaped electrically conductive layer; and contact via structures that contact a respective one of the non-horizontally-extending portions of the L-shaped electrically conductive layers;

wherein the three-dimensional memory device comprises a vertical NAND device located over the substrate;

the L-shaped electrically conductive layers comprise word lines of the vertical NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

2. The three-dimensional memory device of claim 1, wherein each respective non-horizontally-extending portion of the L-shaped insulating layers and the L-shaped electrically conductive layers extends at angle of 60 to 90 degrees with respect to a horizontal direction which is parallel to the top surface of the substrate.

3. The three-dimensional memory device of claim 2, wherein each respective non-horizontally-extending portion of the L-shaped insulating layers and the L-shaped electrically conductive layers comprise vertically-extending portions.

4. The three-dimensional memory device of claim 3, wherein each respective horizontally-extending portion has a uniform vertical thickness and each respective vertically-extending portion has a uniform horizontal thickness.

5. The three-dimensional memory device of claim 3, further comprising a mesa structure located over the substrate, wherein each respective non-horizontally-extending portion of the L-shaped insulating layers and the L-shaped electrically conductive layers is located over a sidewall of the mesa structure.

6. The three-dimensional memory device of claim 3, wherein the horizontally-extending portions of the L-shaped electrically conductive layers contact a bottom surface of a respective overlying one of the horizontally-extending portions of the L-shaped insulating layers and a top surface of a respective underlying one of the horizontally-extending portions of the L-shaped insulating layers.

7. The three-dimensional memory device of claim 3, wherein a plurality of the vertically-extending portions of the L-shaped electrically conductive layers contacts a sidewall of a respective one of the L-shaped insulating layers and a sidewall of a respective one of the dielectric spacers.

8. The three-dimensional memory device of claim 3, wherein the contact via structures straddle the respective one of the vertically-extending portions of the L-shaped electrically conductive layers and include a respective pair of downward-protruding portions.

9. The three-dimensional memory device of claim 8, wherein the respective pair of downward-protruding portions contacts a sidewall of one of the dielectric spacers and a sidewall of one of the vertically-extending portions of the L-shaped insulating layers.

10. The three-dimensional memory device of claim 3, further comprising at least one contact level dielectric layer overlying the memory stack structures and the vertically-extending portions of the L-shaped insulating layers and the L-shaped electrically conductive layers, wherein the contact via structures extend through the at least one contact level dielectric layer and wherein the contact via structures have a same height that is greater than a total thickness of the at least one contact level dielectric layer.

11. The three-dimensional memory device of claim 3, wherein each of the L-shaped electrically conductive layers further comprises a tapered portion which extends in a direction between the vertical and horizontal directions and which connects respective vertically-extending and horizontally-extending portions of the respective L-shaped electrically conductive layers.

12. A method of forming a three-dimensional memory device, comprising:
forming a mesa structure over a substrate;
performing multiple times a set of processing steps comprising a dielectric spacer formation step in which dielectric spacers are formed, an insulating layer deposition step in which an insulating layer is conformally deposited, and a sacrificial material layer deposition step in which a sacrificial material layer is conformally deposited;
removing portions of the insulating layers, the dielectric spacers, and the sacrificial material layers from above a horizontal plane including a top surface of the mesa structure by a planarization process, wherein an alternating stack of L-shaped insulating layers and L-shaped sacrificial material layers is formed over the substrate and on a sidewall of the mesa structure;
forming memory stack structures through a memory array region of the alternating stack that includes the horizontally-extending portions of the L-shaped sacrificial material layers, wherein each of the memory stack structures comprises a memory film and a vertical semiconductor channel;
replacing the L-shaped sacrificial material layers with L-shaped electrically conductive layers; and
forming contact via structures on a respective one of vertically-extending portions of the L-shaped electrically conductive layers;
wherein
the dielectric spacers extend non-horizontally between neighboring pairs of each one of a non-horizontally-extending portion of an L-shaped insulating layer and each one of a non-horizontally-extending portion of an L-shaped electrically conductive layer;
the three-dimensional memory device comprises a vertical NAND device located over the substrate;
the L-shaped electrically conductive layers comprise word lines of the vertical NAND device;
the substrate comprises a silicon substrate;
the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

13. The method of claim 12, wherein the sacrificial material layer is deposited directly on horizontal surfaces of the insulating layer within each set of processing steps.

14. The method of claim 12, wherein the dielectric spacer is formed by deposition of a continuous dielectric material layer and subsequently removing horizontal portions of the continuous dielectric material layer employing an anisotropic etch process within each set of processing steps.

15. The method of claim 12, wherein:

each of the L-shaped insulating layers and the L-shaped electrically conductive layers includes a respective horizontally-extending portion having a uniform vertical thickness and a respective vertically-extending portion having a uniform horizontal thickness; and the dielectric spacers are located between neighboring pairs of a vertically-extending portion of an L-shaped insulating layer and a vertically-extending portion of an L-shaped electrically conductive layer.

16. The method of claim 12, further comprising:

forming at least one contact level dielectric layer over the memory stack structures and the vertically-extending portions of the L-shaped insulating layers and the L-shaped electrically conductive layers; and forming contact via cavities through the at least one contact level dielectric layer, wherein a respective one of the vertically-extending portions of the L-shaped electrically conductive layers is physically exposed at a bottom of each of the contact via cavities, and the contact via structures are formed in the contact via cavities.

17. The method claim 16, wherein:

a pair of sidewalls of the respective one of the vertically-extending portions of the L-shaped electrically conductive layers is physically exposed within each of the contact via cavities;

the contact via structure includes a respective pair of downward-protruding portions that straddles a respective one of the vertically-extending portions of the L-shaped electrically conductive layers; and the respective pair of downward-protruding portions contacts a sidewall of one of the dielectric spacers and a sidewall of one of the vertically-extending portions of the L-shaped insulating layers.

18. The method of claim 12, further comprising:

forming a first dielectric wall structure through the vertically-extending portions of the L-shaped insulating layers and the L-shaped sacrificial material layers of the alternating stack; and forming a second dielectric wall structure through the horizontally-extending portions of the L-shaped insulating layers and the L-shaped electrically conductive layers.

* * * * *